United States Patent
Asakura

(10) Patent No.: US 11,223,791 B2
(45) Date of Patent: Jan. 11, 2022

(54) SIGNAL PROCESSING CIRCUIT, SOLID-STATE IMAGING ELEMENT, AND METHOD FOR CONTROLLING SIGNAL PROCESSING CIRCUIT

(71) Applicant: Sony Semiconductor Solutions Corporation, Kanagawa (JP)

(72) Inventor: Luonghung Asakura, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 15/734,850

(22) PCT Filed: Mar. 20, 2019

(86) PCT No.: PCT/JP2019/011780
§ 371 (c)(1),
(2) Date: Dec. 3, 2020

(87) PCT Pub. No.: WO2019/239670
PCT Pub. Date: Dec. 19, 2019

(65) Prior Publication Data
US 2021/0235034 A1 Jul. 29, 2021

(30) Foreign Application Priority Data

Jun. 14, 2018 (JP) .............................. JP2018-113236
Aug. 3, 2018 (JP) .............................. JP2018-146731

(51) Int. Cl.
*H04N 5/378* (2011.01)
*H04N 5/351* (2011.01)
(Continued)

(52) U.S. Cl.
CPC .............. *H04N 5/378* (2013.01); *H04N 5/351* (2013.01); *H04N 5/363* (2013.01); *H04N 5/365* (2013.01)

(58) Field of Classification Search
CPC ........ H04N 5/378; H04N 5/351; H04N 5/365; H04N 5/363
See application file for complete search history.

(56) References Cited

U.S. PATENT DOCUMENTS

2004/0080637 A1 4/2004 Nakamura et al.
2009/0225211 A1* 9/2009 Oike ...................... H04N 5/378
348/308
(Continued)

FOREIGN PATENT DOCUMENTS

EP 2750376 A2 7/2014
JP 07-86943 A 3/1995
(Continued)

OTHER PUBLICATIONS

International Search Report, International Application No. PCT/JP2019/011780, dated Jun. 3, 2019.
(Continued)

*Primary Examiner* — Nhan T Tran
(74) *Attorney, Agent, or Firm* — Michael Best & Friedrich LLP

(57) ABSTRACT

In a digital signal processing circuit that performs AD conversion using a comparison device and a counter, the speed of the AD conversion is increased. An attenuation unit, in a case where the level of an input signal exceeds a predetermined threshold value, attenuates the input signal and outputs it as an output signal. The comparison device compares the output signal with a predetermined reference signal that changes with lapse of time, and outputs the comparison result. The counter counts a count value until the comparison result is inverted and outputs a digital signal indicating the count value. The digital signal processing unit performs multiplication processing on the digital signal.

12 Claims, 30 Drawing Sheets

(51) Int. Cl.
   *H04N 5/363*    (2011.01)
   *H04N 5/365*    (2011.01)

(56)        References Cited

U.S. PATENT DOCUMENTS

2011/0134295 A1*  6/2011  Shigeta ............... H04N 5/3745
                                                      348/300
2013/0229543 A1*  9/2013  Hashimoto ........ H04N 5/35545
                                                      348/222.1

FOREIGN PATENT DOCUMENTS

JP          07086943    *   3/1995    .............. H03M 1/18
JP          2008-98722 A    4/2008
JP          2011-120094 A   6/2011
JP          2015-231096 A   12/2015
WO          2018021054 A1   2/2018

OTHER PUBLICATIONS

Extended European Search Report dated Jun. 29, 2021 for corresponding European Application No. 19819164.5.

* cited by examiner

FIG. 6

| Lat_out | OPERATION OF DIGITAL SIGNAL PROCESSING UNIT |
|---|---|
| 0 | OUTPUT Cnt_out AS IMAGE DATA P |
| 1 | OUTPUT Cnt_out×(1/k) AS IMAGE DATA P |

FIG. 8

| Lat_ctrl | Lat_set | Lat_rst | OPERATION OF LATCH CIRCUIT |
|---|---|---|---|
| 0/1 | 1 | 0 | SET Lat_out TO 1 |
| 0/1 | 0 | 1 | RESET Lat_out TO 0 |
| 0 | 0 | 0 | HOLD STATE |
| 1 | 0 | 0 | UPDATE WITH INPUT VALUE (Cmp_out) |

FIG. 18

| MODE | Lat_out | OPERATION OF DIGITAL SIGNAL PROCESSING UNIT |
|---|---|---|
| 0 (NORMAL MODE) | 0 (LOW ILLUMINANCE) | OUTPUT Cnt_out AS IMAGE DATA P |
| | 1 (HIGH ILLUMINANCE) | OUTPUT (Cnt_out−Ofs)×(1/k) AS IMAGE DATA P |
| 1 (OFFSET CALCULATION MODE) | 0/1 | CALCULATE OFFSET COMPONENT Ofs |

FIG. 23
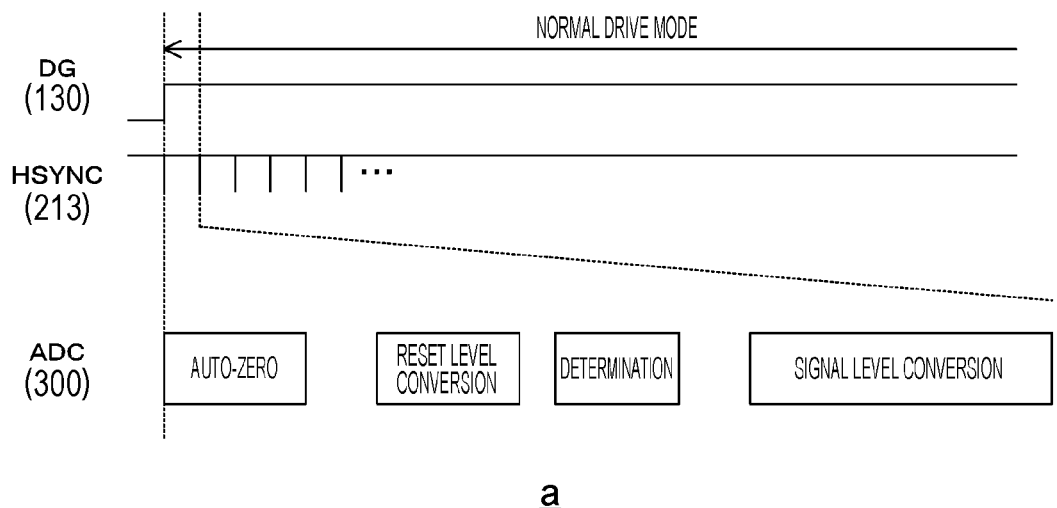
a
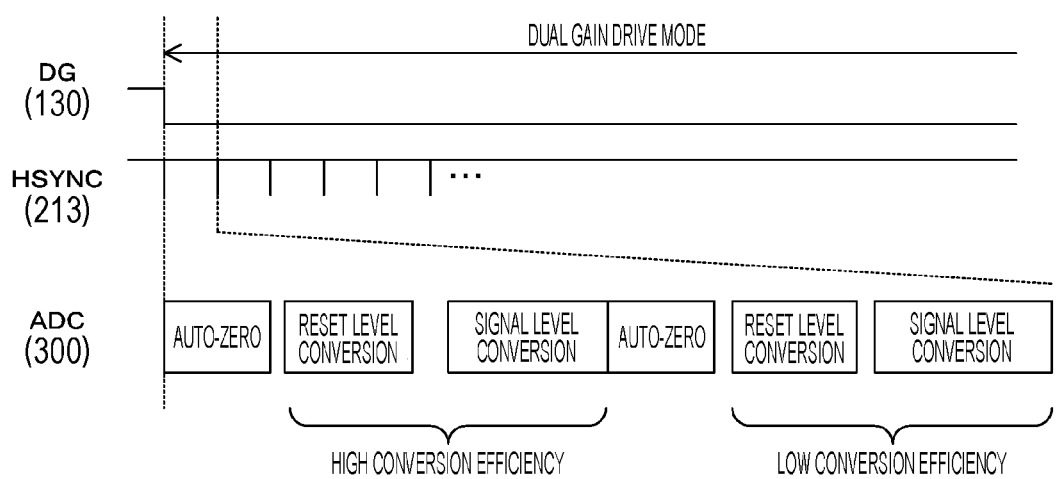
b

FIG. 28
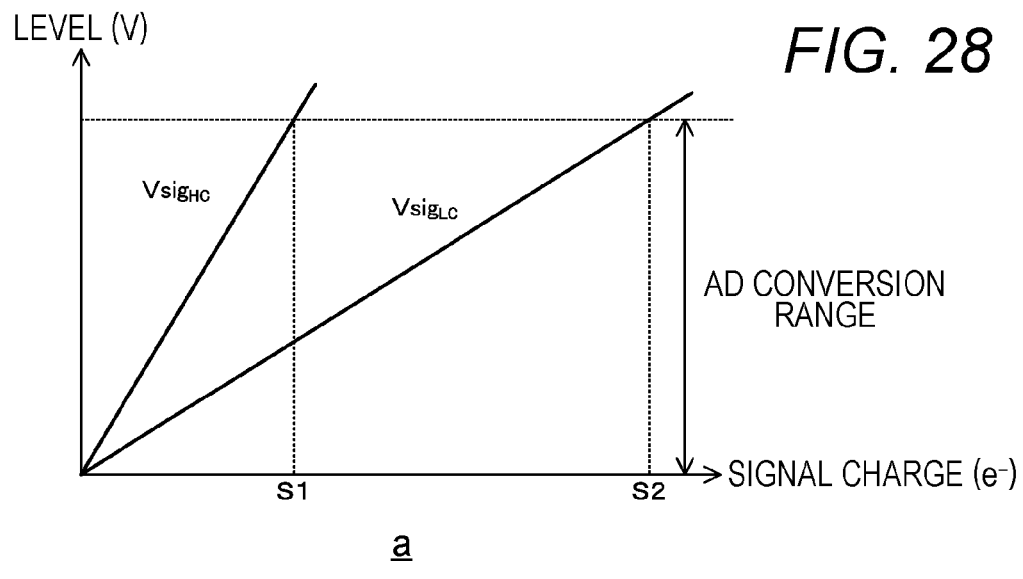
a
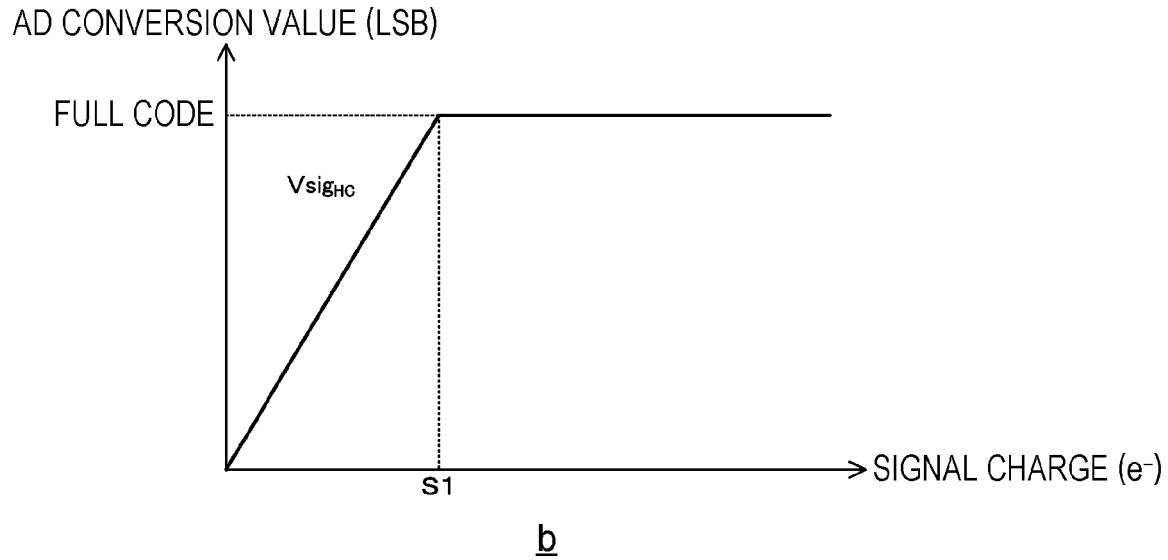
b
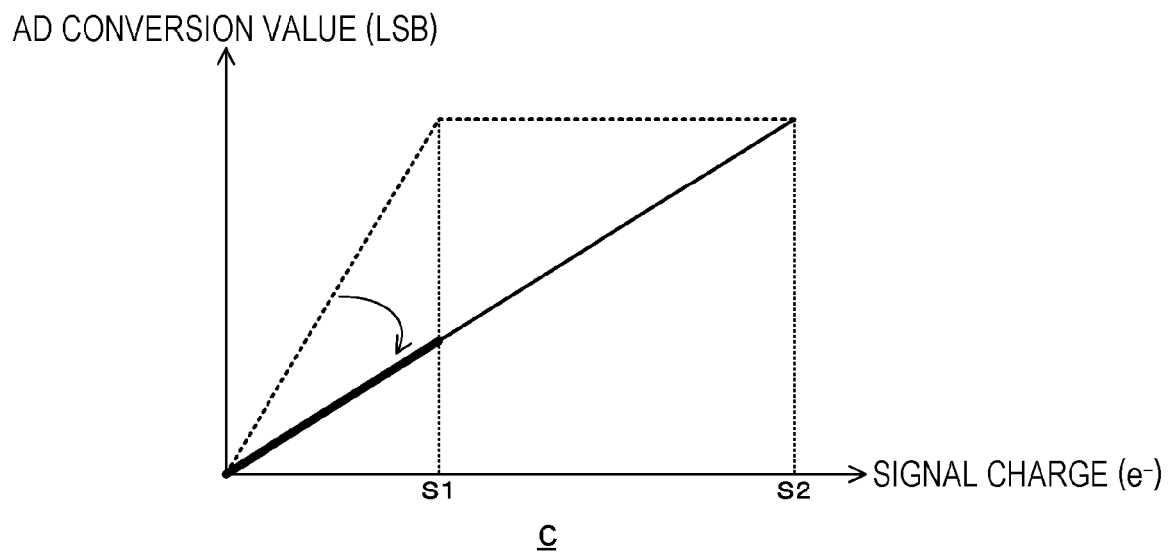
c

SIGNAL PROCESSING CIRCUIT, SOLID-STATE IMAGING ELEMENT, AND METHOD FOR CONTROLLING SIGNAL PROCESSING CIRCUIT

TECHNICAL FIELD

The present technology relates to a signal processing circuit, a solid-state imaging element, and a method for controlling the signal processing circuit. More specifically, the present technology relates to a signal processing circuit that converts an analog signal into a digital signal, a solid-state imaging element, and a method for controlling the signal processing circuit.

BACKGROUND ART

Conventionally, in a solid-state imaging element, a column analog-to-digital converter (ADC) method in which an ADC is arranged for each column of pixels has been widely used. For example, there has been proposed a solid-state imaging element in which a single-slope ADC including a comparison device and a counter is arranged for each column (see, for example, Patent Document 1). In this ADC, the comparison device compares a sawtooth reference signal with the analog pixel signal. Then, the counter counts the count value over a period until the comparison result is inverted, and outputs a digital signal indicating the count value.

CITATION LIST

Patent Document

Patent Document 1: Japanese Patent Application Laid-Open No. 2008-98722

SUMMARY OF THE INVENTION

Problems to be Solved by the Invention

In the above-mentioned conventional technique, analog-to-digital (AD) conversion can be performed on an analog pixel signal with a simple configuration including a comparison device and a counter. However, in the above-mentioned ADC, the higher the illuminance, the higher the level of the pixel signal. Due to the increase in the level of the pixel signal, there is a problem that the time until the comparison result is inverted becomes long and the AD conversion speed becomes slow.

The present technology has been created in view of such a situation, and an object is to increase the speed of AD conversion in a digital signal processing circuit that performs AD conversion using a comparison device and a counter.

Solutions to Problems

The present technology has been made in order to solve the aforementioned problem, and a first aspect is a signal processing circuit including: an attenuation unit that, in a case where a level of an input signal exceeds a predetermined threshold value, attenuates the input signal and outputs the input signal as an output signal; a comparison device that compares the output signal with a predetermined reference signal that varies with lapse of time, and outputs a comparison result; a counter that counts a count value until the comparison result is inverted and outputs a digital signal indicating the count value; and a digital signal processing unit that performs multiplication processing on the digital signal, and a method for controlling the same. Therefore, an operation is provided in which in a case where the level of the input signal exceeds the predetermined threshold value, the attenuated input signal is converted into a digital signal.

Furthermore, according to the first aspect, the attenuation unit may attenuate the input signal at a predetermined attenuation rate in a case where the level exceeds the threshold value, and the digital signal processing unit may perform the multiplication processing that multiplies a reciprocal of the attenuation rate on the digital signal. Therefore, an operation is provided in which multiplication of a reciprocal is performed for the amount attenuated by the attenuation rate.

Furthermore, the first aspect may further include: a sample-hold circuit that holds a predetermined reset level and outputs the predetermined reset level from an output terminal, in which a level of a signal line that transmits the input signal changes to one of the reset level and the signal level, and the attenuation unit may include: a first capacitance that is inserted between the signal line and an input terminal of the comparison device; a second capacitance that has one end connected to the input terminal of the comparison device; and a selector that, in a case where a difference between the reset level and the signal level exceeds the threshold value, selects the output terminal of the sample-hold circuit and connects the output terminal to another end of the second capacitance and, in a case where the level does not exceed the threshold value, selects the signal line and connects the signal line to the another end. Therefore, an operation is provided in which in a case where the level of the input signal exceeds the threshold value, the reset level is supplied to the second capacitance and the signal level is supplied to the first capacitance.

Furthermore, the first aspect may further include: a latch circuit that holds the comparison result and supplies the comparison result to the selector when the level of the signal line changes to the signal level, in which a level of the reference signal when the level of the signal line changes to the signal level is a level corresponding to the threshold value, and the selector switches a connection destination of the another end of the second capacitance according to the comparison result. Therefore, an operation is provided in which the connection destination of the second capacitance is switched according to the comparison result held by the latch circuit.

Furthermore, according to the first aspect, the digital signal processing unit may include: an offset calculation unit that calculates an offset component generated in the sample-hold circuit; an offset holding unit that holds the offset component; and a correction processing unit that removes the held offset component in the multiplication processing. Therefore, an operation is provided in which the offset component is corrected.

Furthermore, according to the first aspect, the digital signal processing unit may further include: a statistical processing unit that obtains an amount of statistics of a plurality of the digital signals, and the offset calculation unit may calculate the offset component from the amount of statistics. Therefore, an operation is provided in which the offset component calculated from the amount of statistics of the digital signal is corrected.

Furthermore, the first aspect may further include: a sample-hold circuit that holds a predetermined reset level and outputs the predetermined reset level from an output terminal, in which a level of a signal line that transmits the input signal changes to one of the reset level and the signal level, and the attenuation unit may include: a first selector that, in a case where a difference between the reset level and the signal level exceeds the threshold value, selects the output terminal of the sample-hold circuit and, in a case where the level does not exceed the threshold value, selects the signal line; a plurality of capacitances that is connected in parallel to an input terminal of the comparison device; and a second selector that connects some of the plurality of capacitances to an output terminal of the first selector and rest to the signal line according to a predetermined setting value. Therefore, an operation is provided in which some of the plurality of capacitances are connected to the first selector and the rest is connected to the signal line.

Furthermore, the first aspect may further include: a sample-hold circuit that holds a predetermined reset level and outputs the predetermined reset level from an output terminal, in which a level of a signal line that transmits the input signal changes to one of the reset level and the signal level, and the attenuation unit may include: a first capacitance that has one end connected to an input terminal of the comparison device; a second capacitance that has one end connected to the input terminal of the comparison device; a first capacitance-side selector that connects one of the signal line and the output terminal to another end of the first capacitance according to a predetermined selection signal; and a second capacitance-side selector that, in a case where a difference between the reset level and the signal level exceeds the threshold value, selects the output terminal of the sample-hold circuit and connects the output terminal to another end of the second capacitance and, in a case where the level does not exceed the threshold value, selects the signal line and connects the signal line to the other end. Therefore, an operation is provided in which each of the first capacitance and the second capacitance is connected to the signal line or the output terminal of the sample-hold circuit.

Furthermore, a second aspect of the present technology is a solid-state imaging element including: a normal pixel that photoelectrically converts incident light and generates an analog input signal; an attenuation unit that, in a case where a level of an input signal exceeds a predetermined threshold value, attenuates the input signal and outputs the input signal as an output signal; a comparison device that compares the output signal with a predetermined reference signal that varies with lapse of time, and outputs a comparison result; a counter that counts a count value until the comparison result is inverted and outputs a digital signal indicating the count value; and a digital signal processing unit that performs multiplication processing on the digital signal. Therefore, an operation is provided in which in a case where the level of the pixel signal exceeds the predetermined threshold value, the attenuated pixel signal is converted into a digital signal.

Furthermore, the second aspect may further include: a dummy pixel that inputs a dummy signal corresponding to a predetermined reference voltage to the attenuation unit as the input signal; and a sample-hold circuit that holds a predetermined reset level and outputs the predetermined reset level from an output terminal, in which a level of a signal line that transmits the input signal changes to one of the reset level and the signal level, and the attenuation unit may include: a first capacitance that is inserted between the signal line and an input terminal of the comparison device; a second capacitance that has one end connected to the input terminal of the comparison device; and a first selector that, in a case where a difference between the reset level and the signal level exceeds the threshold value, selects the output terminal of the sample-hold circuit and connects the output terminal to another end of the second capacitance and, in a case where the signal level does not exceed the threshold value, selects the signal line and connects the signal line to the other end, and the digital signal processing unit, in a case where the dummy signal is input, may calculate an offset component generated in the sample-hold circuit from the digital signal. Therefore, an operation is provided in which the offset component is calculated from the digital signal corresponding to the dummy signal.

Furthermore, the second aspect may further include: a sample-hold circuit that holds a predetermined reset level and outputs the predetermined reset level from an output terminal, in which a level of a signal line that transmits the input signal changes to one of the reset level and the signal level, and the attenuation unit may include: a first capacitance that has one end connected to an input terminal of the comparison device; a second capacitance that has one end connected to the input terminal of the comparison device; a first capacitance-side selector that connects one of the signal line and the output terminal to another end of the first capacitance according to a predetermined selection signal; and a second capacitance-side selector that, in a case where a difference between the reset level and the signal level exceeds the threshold value, selects the output terminal of the sample-hold circuit and connects the output terminal to another end of the second capacitance and, in a case where the level does not exceed the threshold value, selects the signal line and connects the signal line to the another end. Therefore, an operation is provided in which each of the first capacitance and the second capacitance is connected to the signal line or the output terminal of the sample-hold circuit.

Furthermore, according to the second aspect, the pixel, in a case where a predetermined normal mode is set, may generate the input signal with one of high conversion efficiency that is a charge-voltage conversion efficiency higher than a predetermined value and low conversion efficiency that is a charge-voltage conversion efficiency lower than the predetermined value and, in a case where a predetermined dual gain mode is set, generate the input signal with both the high conversion efficiency and the low conversion efficiency, and the first capacitance-side selector, in a case where the normal mode is set, may connect the signal line to another end of the first capacitance and, in a case where the dual gain mode is set, connect the output terminal to the another end in a period of the reset level generated with the low conversion efficiency and connects the signal line to the another end outside the period. Therefore, an operation is provided in which in the dual gain drive mode, the pixel signal with both high conversion efficiency and low conversion efficiency is AD-converted.

Effects of the Invention

According to the present technology, in a digital signal processing circuit that performs AD conversion using a comparison device and a counter, an excellent effect that the AD conversion speed can be increased can be obtained. Note that effects described herein are not necessarily limited, but may also be any of those described in the present disclosure.

BRIEF DESCRIPTION OF DRAWINGS

FIG. 6 is a diagram illustrating an example of an operation of a digital signal processing unit according to the first embodiment of the present technology.

FIG. 8 is a diagram illustrating an example of an operation of a latch circuit according to the first embodiment of the present technology.

FIG. 18 is a diagram illustrating an example of an operation of a digital signal processing unit according to the second embodiment of the present technology.

FIG. 23 is a timing chart illustrating an example of an operation of an ADC in each of a normal drive mode and a dual gain drive mode according to the third embodiment of the present technology.

FIG. 28 is a graph illustrating an example of a relationship between pixel signal level, AD conversion value, and signal charge amount according to the third embodiment of the present technology.

MODE FOR CARRYING OUT THE INVENTION

Modes for carrying out the present technology (hereinafter, the embodiments) are described below. A description is given in the order described below.

1. First embodiment (example of attenuating pixel signal)
2. Second embodiment (example of correcting offset component and attenuating pixel signal)
3. Third embodiment (example of attenuating pixel signal during normal driving and not attenuating pixel signal during dual gain driving)
4. Application examples to mobile objects 1. First Embodiment

[Configuration Example of Imaging Apparatus]

Figure 1:
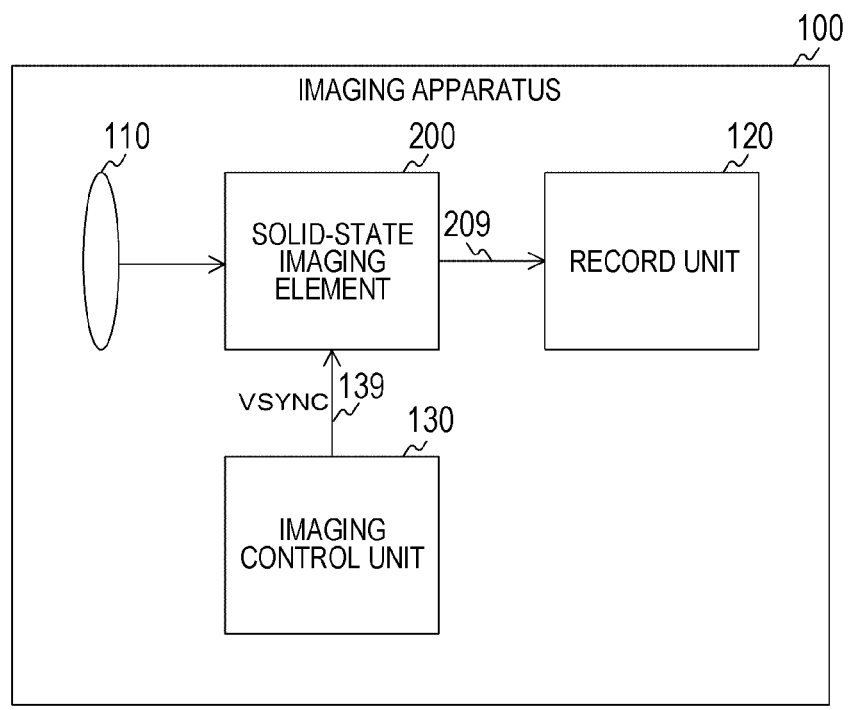
FIG. 1 is a block diagram illustrating a configuration example of an imaging apparatus according to a first embodiment of the present technology.

FIG. 1 is a block diagram illustrating a configuration example of an imaging apparatus 100 according to the first embodiment of the present technology. The imaging apparatus 100 is an apparatus that captures image data, and includes an imaging lens 110, a solid-state imaging element 200, a record unit 120, and an imaging control unit 130. As the imaging apparatus 100, a digital camera such as an IoT camera or an electronic apparatus (e.g., a smartphone or a personal computer) having an imaging function is assumed.

The solid-state imaging element 200 captures image data under the control of the imaging control unit 130. The solid-state imaging element 200 supplies the image data to the record unit 120 via a signal line 209.

The imaging lens 110 collects light and guides the collected light to the solid-state imaging element 200. The imaging control unit 130 causes the solid-state imaging element 200 to capture image data. The imaging control unit 130 supplies, for example, an imaging control signal including a vertical synchronization signal VSYNC to the solid-state imaging element 200 via a signal line 139. The record unit 120 records the image data.

Here, the vertical synchronization signal VSYNC is a signal indicating the timing of imaging, and a cyclic signal having a fixed frequency (e.g., 60 Hertz) is used as the vertical synchronization signal VSYNC.

Note that, although the imaging apparatus 100 records image data, the image data may be transmitted to the outside of the imaging apparatus 100. In this case, an external interface for transmitting the image data is further provided. Alternatively, the imaging apparatus 100 may further display the image data. In this case, a display unit is further provided.

[Configuration Example of Solid-State Imaging Element]

Figure 2:
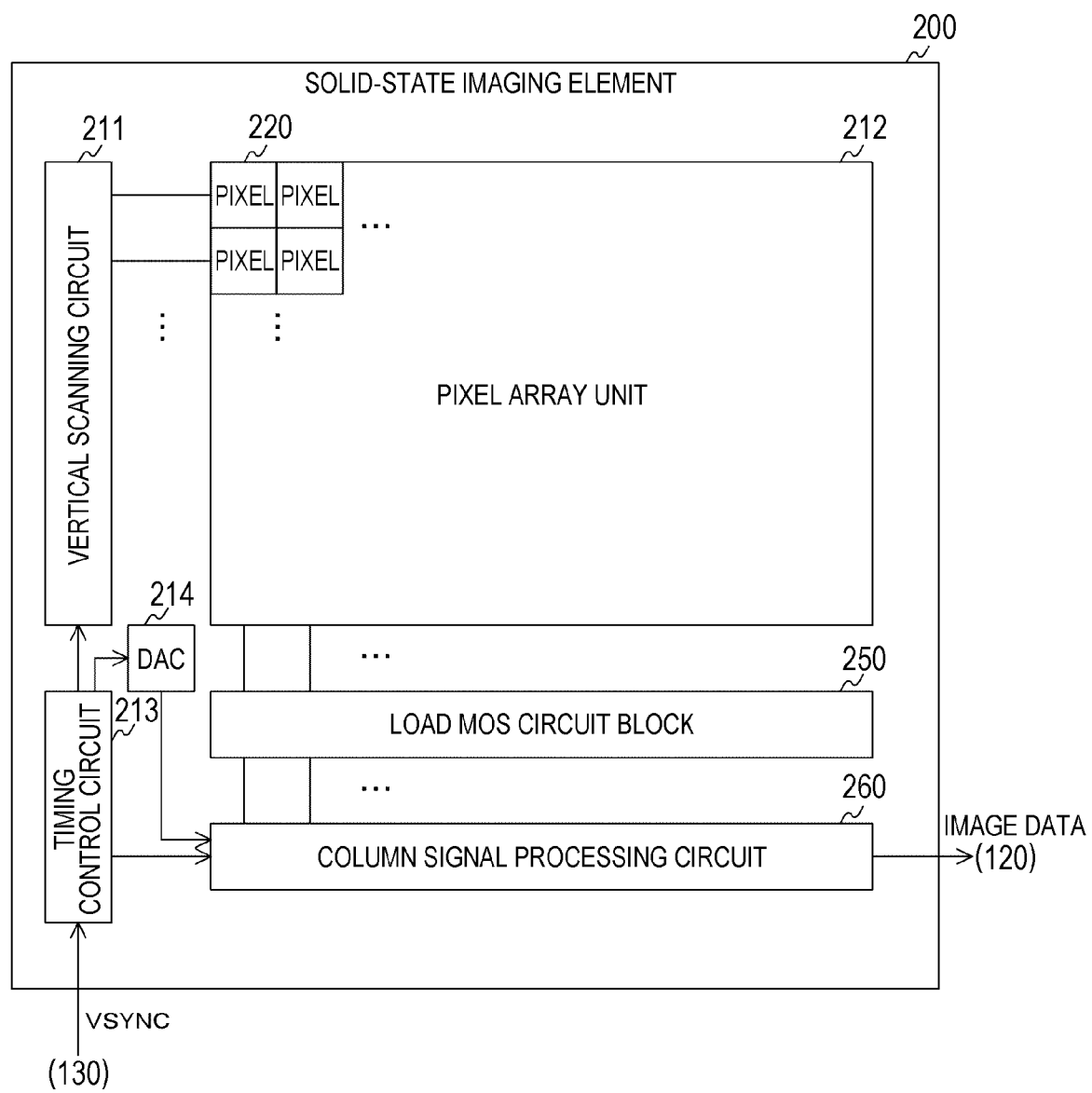
FIG. 2 is a block diagram illustrating a configuration example of a solid-state imaging element according to the first embodiment of the present technology.

FIG. 2 is a block diagram illustrating a configuration example of the solid-state imaging element 200 according to the first embodiment of the present technology. The solid-state imaging element 200 includes a vertical scanning circuit 211, a pixel array unit 212, a timing control circuit 213, a digital to analog converter (DAC) 214, a load MOS circuit block 250, and a column signal processing circuit 260. In the pixel array unit 212, a plurality of pixels 220 is arranged in a two-dimensional lattice shape.

Hereinafter, a set of pixels 220 arranged in a horizontal direction is referred to as a "row", and a set of pixels 220 arranged in a direction perpendicular to the row is referred to as a "column".

The timing control circuit 213 controls the operation timing of each of the vertical scanning circuit 211, the DAC 214, and the column signal processing circuit 260 in synchronization with the vertical synchronization signal VSYNC from the imaging control unit 130.

The DAC 214 uses digital to analog (DA) conversion to generate an analog reference signal that changes with lapse of time. For example, a sawtooth ramp signal is used as a reference signal. The DAC 214 supplies the generated reference signal to the column signal processing circuit 260.

The vertical scanning circuit 211 sequentially selects and drives the rows, and outputs an analog pixel signal. The pixel 220 generates an analog pixel signal by photoelectrically converting incident light. The pixel 220 supplies a pixel signal to the column signal processing circuit 260 via the load MOS circuit block 250.

In the load MOS circuit block 250, a MOS transistor for supplying a constant current is provided for each column.

The column signal processing circuit 260 executes signal processing such as AD conversion processing on pixel signals with respect to each column. The column signal processing circuit 260 supplies image data including the processed signal to the record unit 120. Note that the column signal processing circuit 260 is an example of the signal processing circuit described in the claims.

[Configuration Example of the Pixel]

Figure 3:
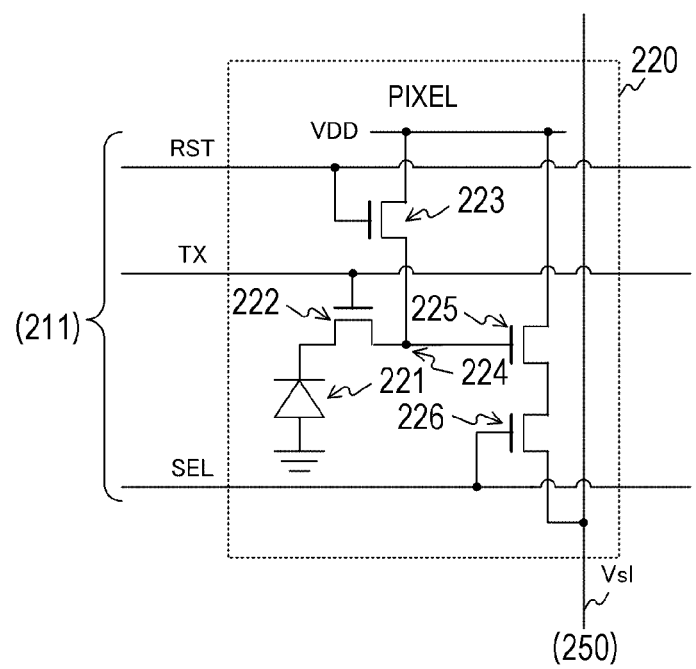
FIG. 3 is a circuit diagram illustrating a configuration example of a pixel according to the first embodiment of the present technology.

FIG. 3 is a circuit diagram illustrating a configuration example of the pixel 220 according to the first embodiment of the present technology. The pixel 220 includes a photodiode 221, a transfer transistor 222, a reset transistor 223, a floating diffusion layer 224, an amplification transistor 225, and a selection transistor 226.

The photodiode 221 photoelectrically converts incident light and generates charges. The transfer transistor 222 transfers charges from the photodiode 221 to the floating diffusion layer 224 according to a transfer signal TX from the vertical scanning circuit 211. The reset transistor 223 initializes the charge amount of the floating diffusion layer 224 according to a reset signal RST from the vertical scanning circuit 211. The floating diffusion layer 224 accumulates charges and generates a voltage corresponding to the charge amount.

The amplification transistor 225 amplifies the signal of the voltage of the floating diffusion layer 224. The selection transistor 226 outputs the amplified signal as a pixel signal to the load MOS circuit block 250 via a vertical signal line Vsl according to the selection signal SEL from the vertical scanning circuit 211.

Note that the circuit of the pixel 220 is not limited to the configuration illustrated in the drawing as long as it can generate a pixel signal by photoelectric conversion.

Figure 4:
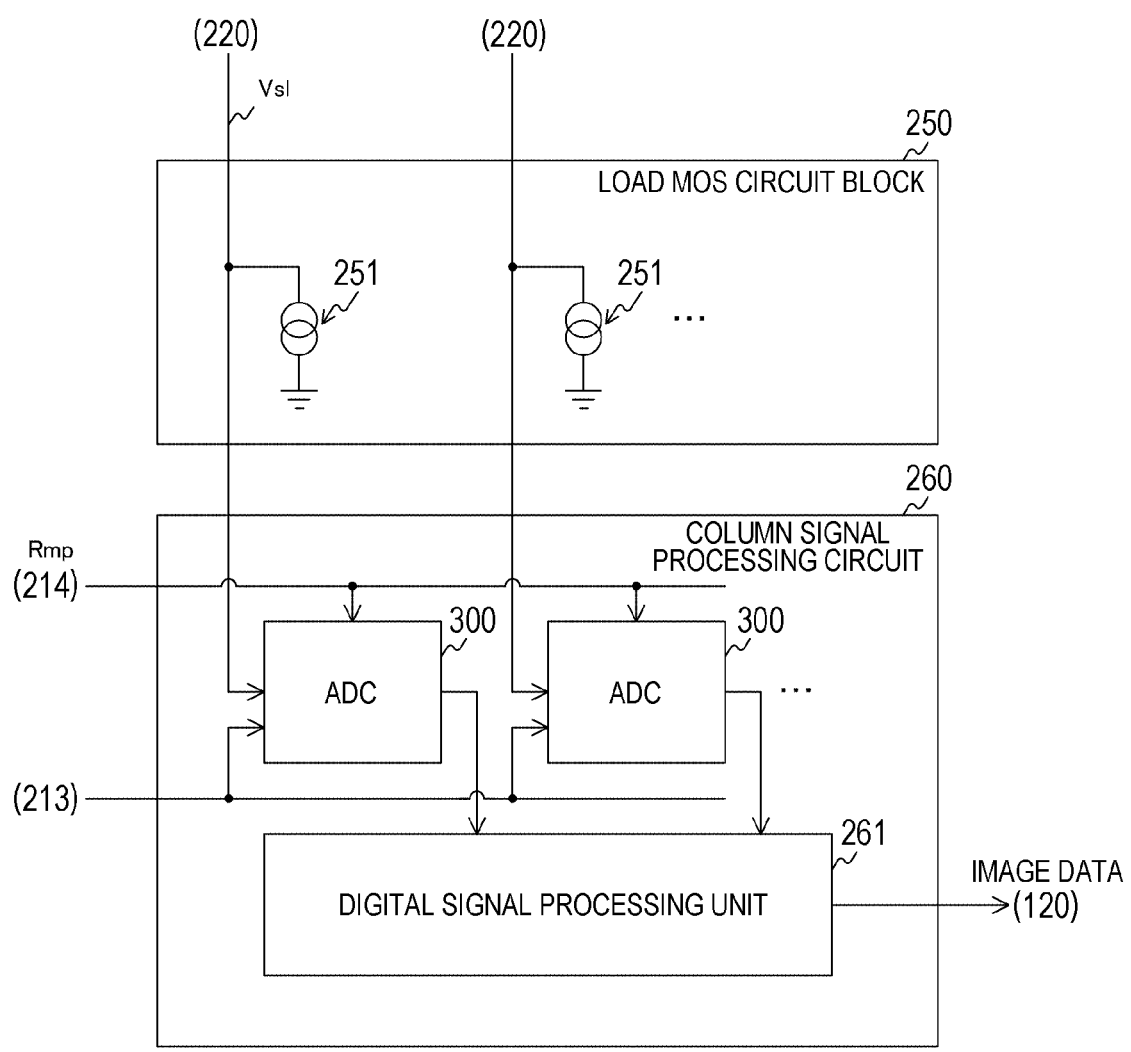
FIG. 4 is a block diagram illustrating a configuration example of a load metal-oxide-semiconductor (MOS) circuit block and a column signal processing column signal processing circuit according to the first embodiment of the present technology.

FIG. 4 is a block diagram illustrating a configuration example of the load MOS circuit block 250 and the column signal processing circuit 260 according to the first embodiment of the present technology.

In the load MOS circuit block 250, a vertical signal line is wired with respect to each column. When the number of columns is I (I is an integer), I vertical signal lines Vsl are wired. Furthermore, a load MOS circuit 251 for supplying a constant current is connected to each of the vertical signal lines Vsl.

A plurality of ADCs 300 and a digital signal processing unit 261 are arranged in the column signal processing circuit 260. The ADC 300 is arranged for each column. When the number of columns is I, I ADCs 300 are arranged. Note that although the column ADC method in which the ADC 300 is arranged for each column is used, the ADC is not limited to this configuration. For example, the ADC 300 may be arranged for each pixel.

The ADC 300 converts the analog pixel signal from the corresponding column into a digital signal using the reference signal (ramp signal Rmp or the like) from the DAC 214. The ADC 300 supplies the digital signal to the digital signal processing unit 261.

The digital signal processing unit 261 performs predetermined signal processing on each digital signal for each column. The details of the processing content will be described later. The digital signal processing unit 261 supplies image data including the processed digital signal to the record unit 120.

[Configuration Example of the ADC]

Figure 5:
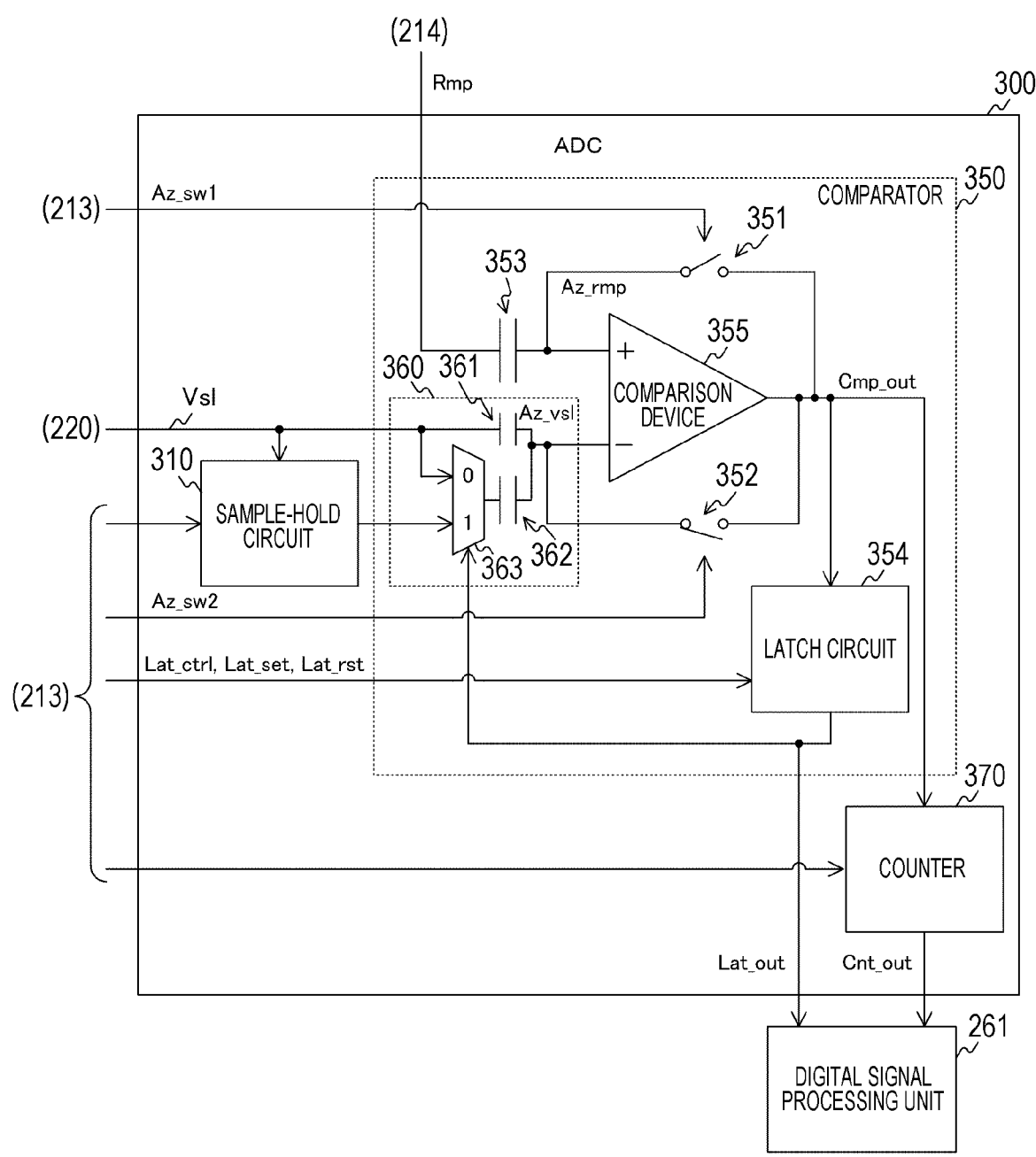
FIG. 5 is a circuit diagram illustrating a configuration example of an ADC according to the first embodiment of the present technology.

FIG. 5 is a circuit diagram illustrating a configuration example of an ADC 300 according to the first embodiment of the present technology. The ADC 300 includes a sample-hold circuit 310, a comparator 350, and a counter 370. Furthermore, the comparator 350 includes switches 351 and 352, a capacitance 353, a latch circuit 354, a comparison device 355, and an attenuation unit 360. The attenuation unit 360 includes capacitances 361 and 362 and a selector 363.

The sample-hold circuit 310 samples and holds the reset level among the reset level and the signal level under the control of the timing control circuit 213. The sample-hold circuit 310 outputs the held reset level from the output terminal.

Here, the reset level means the level of the vertical signal line Vsl at the time when the pixel 220 is initialized by the reset signal RST. Furthermore, the signal level means the level of the vertical signal line Vsl at the time when charges are transferred in the pixel 220 by the transfer signal TX. The difference between the reset level and the signal level indicates the level of the net pixel signal from which the noise component generated when the pixel 220 is reset is removed. Hereinafter, this net pixel signal is referred to as Vsig. Note that the pixel signal Vsig is an example of the input signal described in the claims.

The comparator 350 compares the reference signal with the level (reset level or signal level) of the vertical signal line Vsl. In the comparator 350, the capacitance 353 is inserted between the DAC 214 and the non-inverting input terminal (+) of the comparison device 355.

The switch 351 opens and closes the path between the non-inverting input terminal (+) of the comparison device 355 and its output terminal according to a control signal Az_sw1 from the timing control circuit 213.

The switch 352 opens and closes the path between the inverting input terminal (−) of the comparison device 355 and its output terminal according to a control signal Az_sw2 from the timing control circuit 213.

The comparison device 355 compares a signal Az_rmp input to the non-inverting input terminal (+) with a signal Az_vsl input to the inverting input terminal (−) The comparison device 355 outputs a comparison result Cmp_out to the latch circuit 354 and the counter 370.

Here, the DAC 214 controls the level of the reference signal (ramp signal Rmp) to a value according to a predetermined threshold value Vth immediately before AD conversion of the signal level. The comparison result Cmp_out at this time indicates the result of determining whether or not the pixel signal Vig (that is, the difference between the signal level and the reset level) exceeds the threshold value Vth.

Under the control of the timing control circuit 213, the counter 370 counts the count value from the AD conversion start timing to the time when the comparison result Cmp_out is inverted. This counter 370 supplies a digital signal Cnt_out indicating the count value to the digital signal processing unit 261.

The latch circuit 354 holds the comparison result Cmp_out from the comparison device 355 according to control signals Lat_ctrl, Lat_set, and Lat_rst from the timing control circuit 213. The latch circuit 354 holds the comparison result Cmp_out indicating the result of determining whether or not the level of the pixel signal Vig exceeds the threshold value Vth, and supplies the held value as a determination result Lat_out to the digital signal processing unit 261 and the attenuation unit 360.

The attenuation unit 360 attenuates the pixel signal Vsig in a case where the level of the pixel signal Vsig exceeds the threshold value Vth. In the attenuation unit 360, the capacitance 361 is inserted between the vertical signal line Vsl and the inverting input terminal (−) of the comparison device 355. Furthermore, one end of the capacitance 362 is connected to the inverting input terminal (−) of the comparison device 355. Note that the capacitance 361 is an example of the first capacitance described in the claims, and the capacitance 362 is an example of the second capacitance described in the claims.

The selector 363 selects either the vertical signal line Vsl or the output terminal of the sample-hold circuit 310 according to the determination result Lat_out and connects it to another end of the capacitance 362.

For example, the determination result Lat_out has a logical value "1" in a case where the level of the pixel signal Vsig exceeds the threshold value Vth, and has a logical value "0" in a case where the level is less than or equal to the threshold value Vth. The selector 363 connects the vertical signal line Vsl to the capacitance 362 in a case where the determination result Lat_out is the logical value "0" (that is, the pixel signal Vsig is less than or equal to the threshold value Vth). On the other hand, in a case where the determination result Lat_out is the logical value "1" (that is, the pixel signal Vsig exceeds the threshold value Vth), the selector 363 connects the sample-hold circuit 310 to the capacitance 362.

In a case where the connection destination of the capacitance 362 is the vertical signal line Vsl, the capacitances 361 and 362 are connected in parallel between the vertical signal line Vsl and the inverting input terminal (−) of the comparison device 355. In this case, the pixel signal Vsig is input to the comparison device 355 without being attenuated.

On the other hand, in a case where the connection destination of the capacitance 362 is the sample-hold circuit 310, the reset level held by the sample-hold circuit 310 is input to the capacitance 362 when the signal level is input to the capacitance 361. Here, when the capacitance value of the capacitance 361 is $C_1$ and the capacitance value of the capacitance 362 is $C_2$, a charge amount $Q_1$ accumulated in the capacitance 361 is expressed by the following formula.

$$Q_1 = C_1 \times V_1 \quad \text{Formula 1}$$

In the above formula, $V_1$ is the voltage applied to the capacitance 361.

Furthermore, the charge amount $Q_2$ accumulated in the capacitance 362 is expressed by the following formula.

$$Q_2 = C_2 \times V_2 \quad \text{Formula 2}$$

In the above formula, $V_2$ is the voltage applied to the capacitance 362.

Since $Q_1$ is equal to $Q_2$, the following formula is obtained from Formula 1 and Formula 2.

$$C_1 \times V_1 = C_2 \times V_2 \quad \text{Formula 3}$$

Furthermore, since the signal level and the reset level are applied respectively to the capacitances 361 and 362, the difference (Vsig) is applied to both ends of the combined capacitance in which the capacitances 361 and 362 are connected in series. Therefore, the voltage $V_2$ can be expressed by the following formula.

$$V_2 = V\text{sig} - V_1 \quad \text{Formula 4}$$

When Formula 4 is inserted into Formula 3 to modify Formula 3, the formula described below is obtained.

$$V_1 = (C_2 \times V\text{sig}) / (C_1 + C_2) \quad \text{Formula 5}$$

Since the voltage $V_1$ is the output value of the attenuation unit 360, when this value is Vsig', Formula 5 can be replaced with the following formula.

$$V\text{sig}' = k \times V\text{sig} = \{C_2 / (C_1 + C_2)\} V\text{sig} \quad \text{Formula 6}$$

From Formula 6, when k is a gain for the pixel signal Vsig, the gain k is less than 1. Therefore, in a case where the connection destination of the capacitance 362 is the sample-hold circuit 310, a signal obtained by attenuating the input pixel signal Vsig by the gain k is output as Vsig'.

With the above-described configuration, in a case where the input pixel signal Vsig exceeds the threshold value Vth, the attenuation unit 360 attenuates the pixel signal Vsig by the gain k (in other words, the attenuation rate), and outputs it to the comparison device 355 as the output signal Vsig'.

Note that the ADC 300 performs AD conversion on the pixel signal in the solid-state imaging element 200, but the ADC is not limited to this configuration. For example, the ADC 300 can be provided in an audio device, a measuring device, or the like, and an analog voice signal or a measurement signal can be AD-converted.

FIG. 6 is a diagram illustrating an example of an operation of the digital signal processing unit 261 according to the first embodiment of the present technology. In a case where the determination result Lat_out is "0" (that is, the pixel signal Vsig is less than or equal to the threshold value Vth), the digital signal processing unit 261 outputs the digital signal Cnt_out from the counter 370 as pixel data P as it is.

On the other hand, in a case where the determination result Lat_out is "1" (that is, the pixel signal Vsig exceeds the threshold value Vth), the digital signal processing unit 261 multiplies the digital signal Cnt_out by the reciprocal of the gain k (attenuation rate), and outputs it as the pixel data P. Due to the multiplication, circuit noise of the comparator 350 and the sample-hold circuit 310 may be amplified and the noise characteristics may be deteriorated. However, the kTC noise of the sample-hold circuit 310, which is a dominant component that deteriorates noise, can be effectively reduced by the noise canceling function of the sample-hold circuit 310 itself. Even if the remaining noise component (for example, random noise of the comparator 350) exists, it is smaller than the optical short-circuit noise generated in a high illuminance signal, the adverse effect on the AD conversion characteristics of the high illuminance pixel signal is small.

[Configuration Example of the Sample-Hold Circuit]

Figure 7:
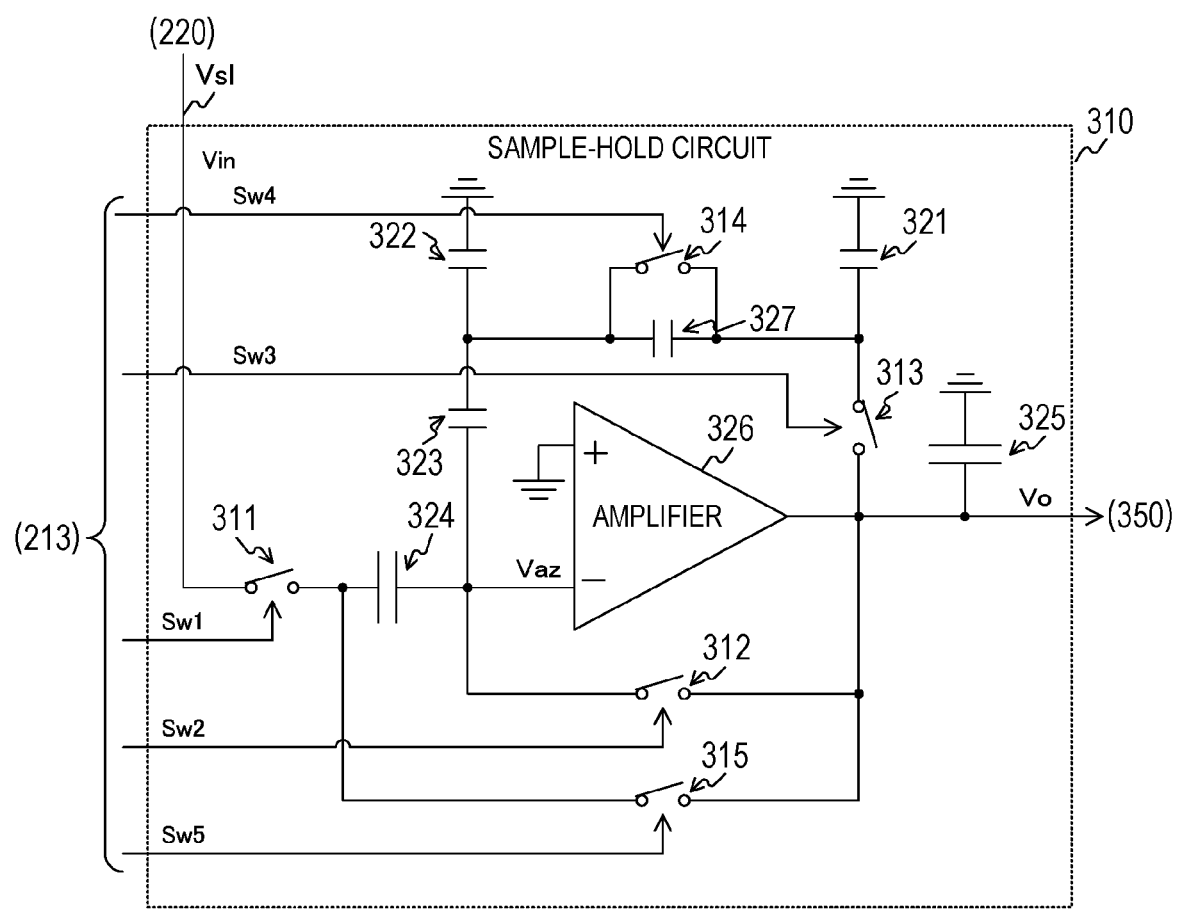
FIG. 7 is a circuit diagram illustrating a configuration example of the sample-hold circuit according to the first embodiment of the present technology.

FIG. 7 is a circuit diagram illustrating a configuration example of the sample-hold circuit 310 according to the first embodiment of the present technology. When the sample-hold circuit 310 samples the level of the vertical signal line Vsl, kTC noise is always generated, which becomes a factor of deteriorating the random noise of the AD conversion result. In order to reduce the influence, it is desirable that the sample-hold circuit 310 have a function of reducing kTC noise. The sample-hold circuit 310 capable of reducing kTC noise includes switches 311 to 315, capacitances 321 to 325, a capacitance 327, and an amplifier 326.

The switch 311 samples the potential of the vertical signal line Vsl according to a control signal Sw1 from the timing control circuit 213 and supplies it to the capacitance 324.

The capacitance 324 holds the sampled level (that is, the reset level). One end of the capacitance 324 is connected to the switch 312, and another end is connected to an inverting input terminal (−) of the amplifier 326.

The switch 312 short-circuits the inverting input terminal (−) and the output terminal of the amplifier 326 according to the control signal Sw2 from the timing control circuit 213.

The switch 314 connects the inverting input terminal (−) and the output terminal of the amplifier 326 via the capacitance 323 and the switch 313 according to the control signal Sw4 from the timing control circuit 213. The capacitance 323 is inserted between one end of the switch 314 and the inverting input terminal (−) of the amplifier 326, and the switch 313 is inserted between another end of the switch 314 and the output terminal of the amplifier 326.

The switch 313 connects the capacitance 321 to the output terminal of the amplifier 326 according to the control signal Sw3 from the timing control circuit 213.

One end of the capacitance 322 is connected to one end of the switch 314, and another end is connected to a ground terminal. One end of the capacitance 327 is connected to the connection point of the capacitances 322 and 323, and another end is connected to the connection point of the capacitance 321 and the switch 313.

The switch 315 short-circuits a node between the switch 312 and the capacitance 324 and the output terminal of the amplifier 326 according to the control signal Sw5 from the timing control circuit 213.

The amplifier 326 amplifies the input signal. The non-inverting input terminal (+) of the amplifier 326 is connected to the ground terminal, and the output terminal is connected to the comparator 350. The potential of the inverting input terminal (−) of the amplifier 326 is Vaz, and the potential of the output terminal is Vo.

The capacitance 325 is a capacitance used to remove a noise component included in the output potential Vo.

The timing control circuit 213 controls the switches 311 to 315 to sample the reset level and hold it in the capacitance 324. Furthermore, the capacitance 325 removes a noise component. In order to sufficiently remove the noise component, it is necessary for the timing control circuit 213 to control the amplifier 326 to an open loop state for a fixed time after sampling. The longer this time is, the higher the effect of reducing the noise component is.

Note that the circuit configuration of the sample-hold circuit 310 is not limited to the configuration illustrated in FIG. 7 as long as it can hold the reset level.

FIG. 8 is a diagram illustrating an example of an operation of the latch circuit 354 according to the first embodiment of the present technology.

In a case where the control signal Lat_set has the logical value "1", the latch circuit 354 sets the determination result Lat_out to the logical value "1". On the other hand, in a case where the control signal Lat_rst has the logical value "1", the latch circuit 354 resets the determination result Lat_out to the logical value "0". Note that it is prohibited to set both the control signals Lat_set and Lat_rst to the logical value "1".

Furthermore, in a case where the control signals Lat_set, Lat_rst, and Lat_ctrl have the logical value "0", the latch circuit 354 holds the value of the determination result Lat_out. In a case where the control signals Lat_set and Lat_rst have the logical value "0" and the control signal Lat_ctrl has the logical value "1", the latch circuit 354 updates the determination result Lat_out with the input value of Cmp_out.

Figure 9:
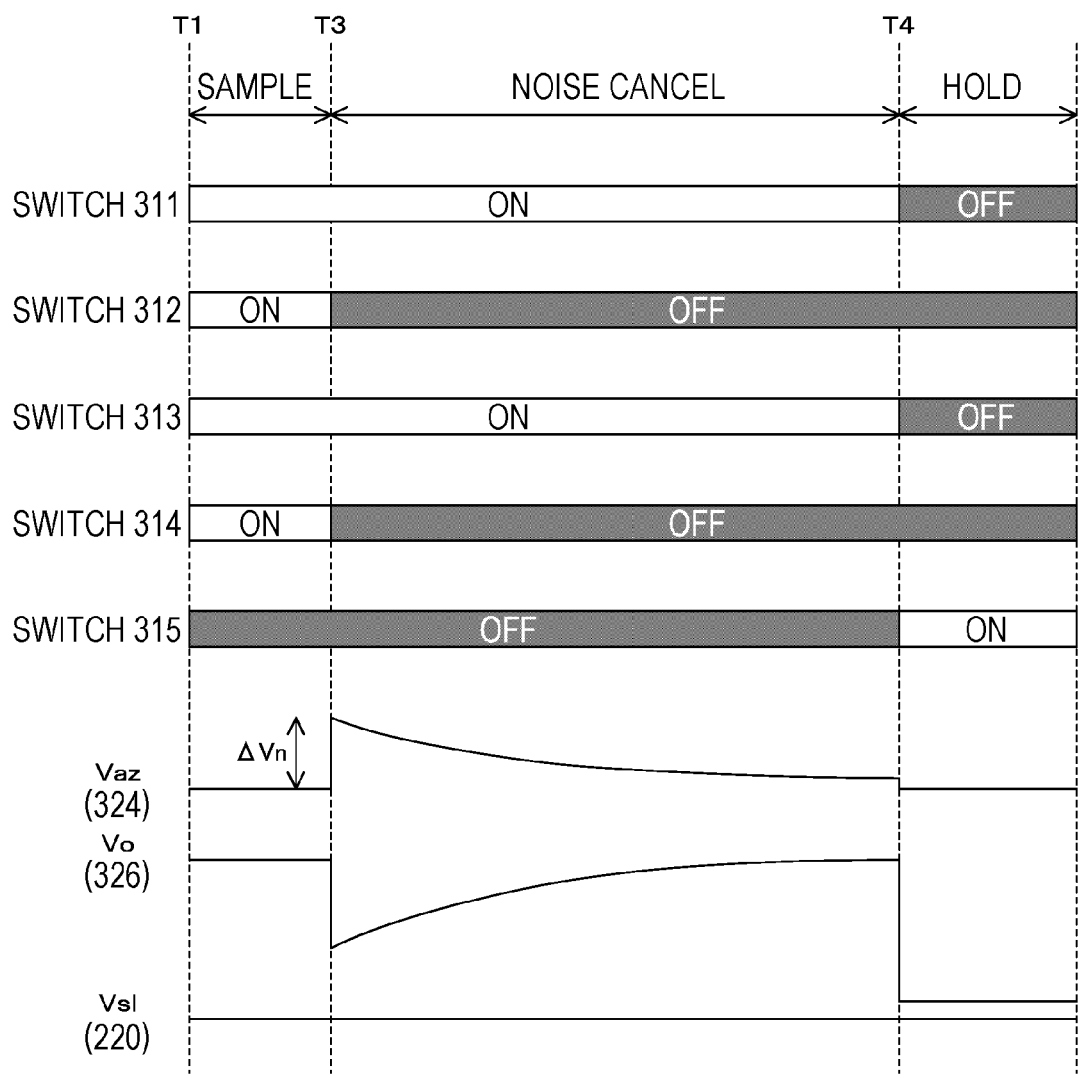
FIG. 9 is a timing chart illustrating an example of an operation of the sample-hold circuit according to the first embodiment of the present technology.

FIG. 9 is a timing chart illustrating an example of an operation of the sample-hold circuit 310 according to the first embodiment of the present technology.

First, the timing control circuit 213 turns on the switch 311 in the initial state. Therefore, the input potential of the sample-hold circuit 310 is connected to the capacitance 324 via the switch 311. Furthermore, the timing control circuit 213 turns on the switch 312 to short-circuit the output terminal and the input terminal of the amplifier 326, and brings the amplifier 326 into an auto-zero state.

The voltage difference between the input-side potential and the output-side potential Vaz of the capacitance 324 is sampled in the capacitance 324. Furthermore, the timing control circuit 213 initializes the capacitances 321, 322, and 323 by turning on the switches 313 and 314 during auto zero.

Next, at timing T3, the timing control circuit 213 turns off the switches 312 and 314 to complete the auto-zero operation. Note that the auto-zero operation is also called a sample operation.

The symbol ΔVn in the drawing indicates kTC noise generated when the switches 312 and 313 are turned off. This kTC noise is inverted and amplified by the open loop amplifier 326 and output from the output terminal of the amplifier 326. The change in the potential Vo at the output terminal is fed back to the input terminal of the amplifier 326 via the switch 313 and the capacitances 321 to 323, and the change in the potential Vaz at the input terminal is in the direction of canceling the original kTC noise.

The remaining noise that cannot be completely canceled is amplified again and fed back. The period from timing T3 to timing T4 in this state is the noise cancellation period. The longer this period is, the more the generated kTC noise is reduced by a repetition of the noise amplification and the feedback operation.

At timing T4, the timing control circuit 213 turns off the switch 313, fixes the feedback amount, and completes the noise canceling operation. Furthermore, the timing control circuit 213 turns off the switch 311 for disconnection from the input terminal and turns on the switch 315 to bring the amplifier 326 into the closed loop state (that is, the hold state). In this hold state, the reset level at the time of sampling appears in the potential Vo on the output side. As will be described later, when the noise canceling operation of the sample-hold circuit 310 is performed in parallel with the conversion of the reset level, the overhead of that time can be hidden. Furthermore, the noise band of the amplifier 326 is determined by the capacitance value of the capacitance 325. The gain of feedback from the potential Vo on the output side to the potential Vaz on the input side is determined by the capacitance value of each of the capacitances 321, 322, and 323.

Figure 10:
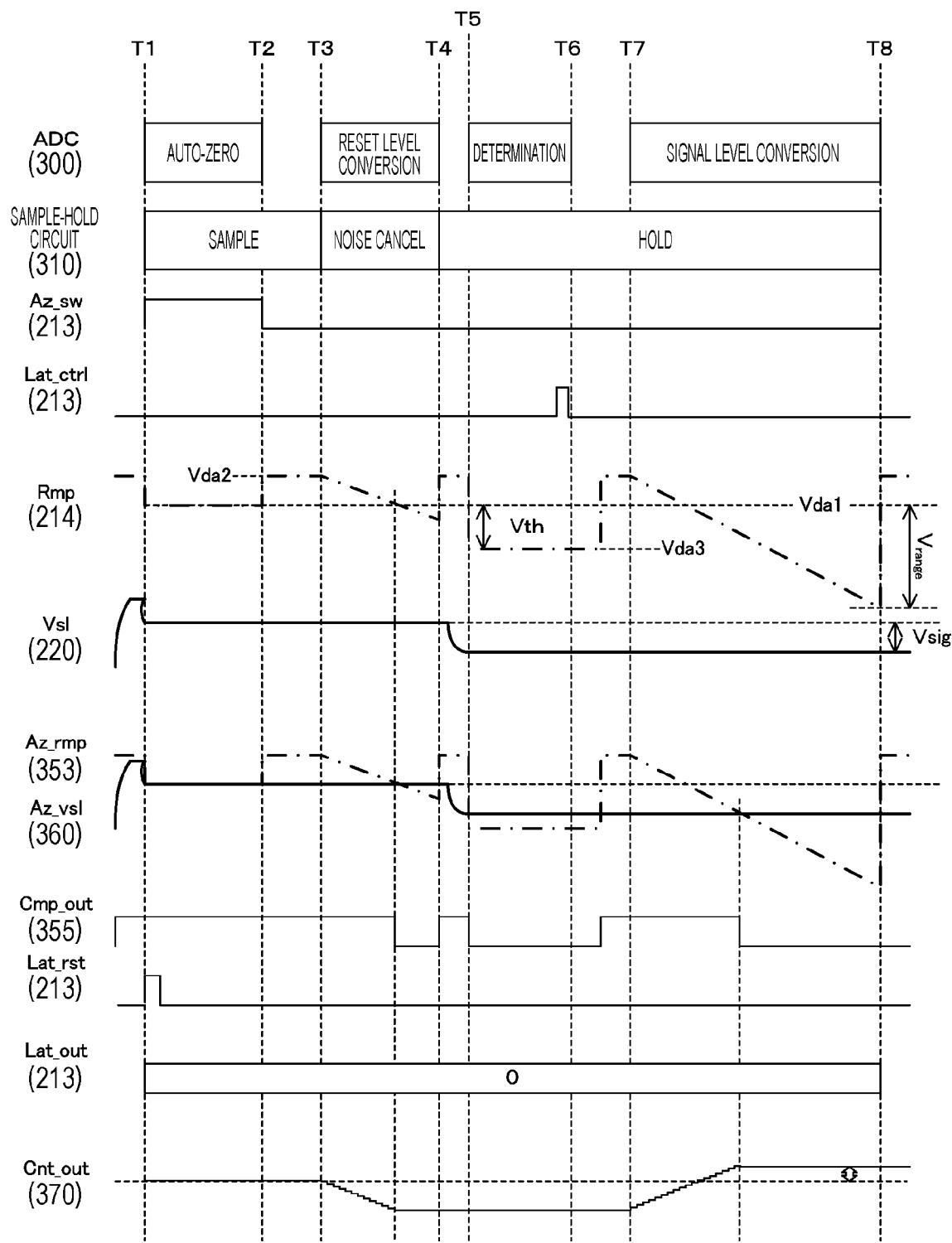
FIG. 10 is a timing chart illustrating an example of an operation of an ADC in a case where illuminance is low according to the first embodiment of the present technology.

FIG. 10 is a timing chart illustrating an example of the operation of the ADC 300 in a case where illuminance is low according to the first embodiment of the present technology.

At timing T1 at the start of the period for reading one row, the vertical scanning circuit 211 resets the floating diffusion layer 224 of the pixel 220. Therefore, a reset level is generated.

On the other hand, the comparator 350 in the ADC 300 performs the auto-zero operation at timing T1 on the basis of the reset level of the vertical signal line Vsl and a reference level Vda1 of the ramp signal Rmp. Furthermore, the sample-hold circuit 310 in the ADC 300 also performs the auto-zero operation in parallel (that is, the sample operation). Furthermore, the timing control circuit 213 supplies the high level control signal Lat_rst for a certain pulse period to reset the latch circuit 354.

At timing T2 when the vertical signal line Vsl settles to a stable potential, the ADC 300 releases the auto-zero state of the comparator 350, and the DAC 214 outputs the ramp signal Rmp of a reference level Vda2.

After the timing T3 when the internal node of the ramp signal Rmp or the comparator 350 settles to a stable potential, the DAC 214 outputs the ramp signal Rmp that gradually decreases with lapse of time. On the other hand, the ADC 300 starts counting. Therefore, the AD conversion of the reset level starts. At that time, the timing control circuit 213 releases the auto-zero state of the sample-hold circuit 310.

The timing control circuit 213 brings the sample-hold circuit 310 into a noise cancel state during the AD conversion of the reset level. The counter 370 in the ADC 300 continues counting until the comparison result Cmp_out of the comparator 350 is inverted.

At timing T4 when the AD conversion of the reset level has been completed, the timing control circuit 213 completes the noise canceling operation of the sample-hold circuit 310. Furthermore, the timing control circuit 213 disconnects the input node of the sample-hold circuit 310 from the vertical signal line Vsl and sets it to the closed loop hold state. Therefore, the reset level of the vertical signal line Vsl at the time of sampling appears at the output node of the sample-hold circuit 310.

After timing T4, the pixel 220 transfers the charge from the photodiode 221 to the floating diffusion layer 224. Therefore, a voltage change depending on the pixel signal Vsig occurs in the vertical signal line Vsl. On the other hand, the DAC 214 sets the ramp signal Rmp to the reference level Vda3. The difference between the reference level Vda3 and the reference level Vda1 is used as a threshold value Vth for comparison with the pixel signal Vsig.

Then, at timings T5 to T6, the comparator 350 in the ADC 300 determines whether or not the level of the pixel signal Vsig exceeds the threshold value Vth.

Here, it is assumed that incident light has such a low illuminance that the level of the pixel signal Vsig, which is the difference (that is, the amplitude) between the reset level and the signal level, is equal to or less than the threshold value Vth.

Since the level of the pixel signal Vsig is equal to or lower than the threshold value Vth, the comparator 350 outputs the low level comparison result Cmp_out at timing T6. Immediately before timing T6, the timing control circuit 213 transmits the high level control signal Lat_ctrl for a certain pulse period. Therefore, the low level comparison result Cmp_out is held in the latch circuit 354 as the determination result Lat_out.

After timing T6, the attenuation unit 360 does not change the connection destination of the capacitance 362 and leaves the vertical signal line Vsl as it is, according to the low level determination result Lat_out. Therefore, the pixel signal Vsig is AD-converted as it is without being attenuated.

After the determination operation is completed, the DAC 214 sets the level of the ramp signal Rmp to the reference level Vda2 again.

At timings T7 to T8 after the internal node of the ramp signal Rmp or the comparator 350 settles to a stable potential, the DAC 214 outputs the ramp signal Rmp that gradually decreases with lapse of time. On the other hand, the ADC 300 performs counting until the comparison result Cmp_out is inverted. Therefore, the AD conversion of the signal level is performed.

Here, the counter 370 performs counting with the polarity of an increment value reversed in each of the reset level AD conversion period and the signal level AD conversion period. For example, in the reset level AD conversion period, the counter 370 performs downcounting by making the increment value negative and outputs the count value Cnt_out. On the other hand, in the signal level AD conversion period, the counter 370 performs upcounting by making the increment value positive and outputs the count value Cnt_out. By thus reversing the polarity of the increment value, the count value Cnt_out at the end of the AD conversion of the signal level becomes the difference between the count value of the reset level and the count value of the signal level. Therefore, correlated double sampling (CDS) processing can be performed inside the ADC 300. The white arrow in the drawing indicates the count value of the pixel signal Vsig.

Note that the ADC 300 performs CDS processing by upcounting and downcounting, but it is not limited to this configuration. For example, the ADC 300 may be configured to perform only one of upcounting and downcounting. In this case, a CDS processing unit is added to the subsequent stage of the ADC 300 (for example, in the digital signal processing unit 261), and the CDS processing unit executes the CDS processing.

Figure 11:
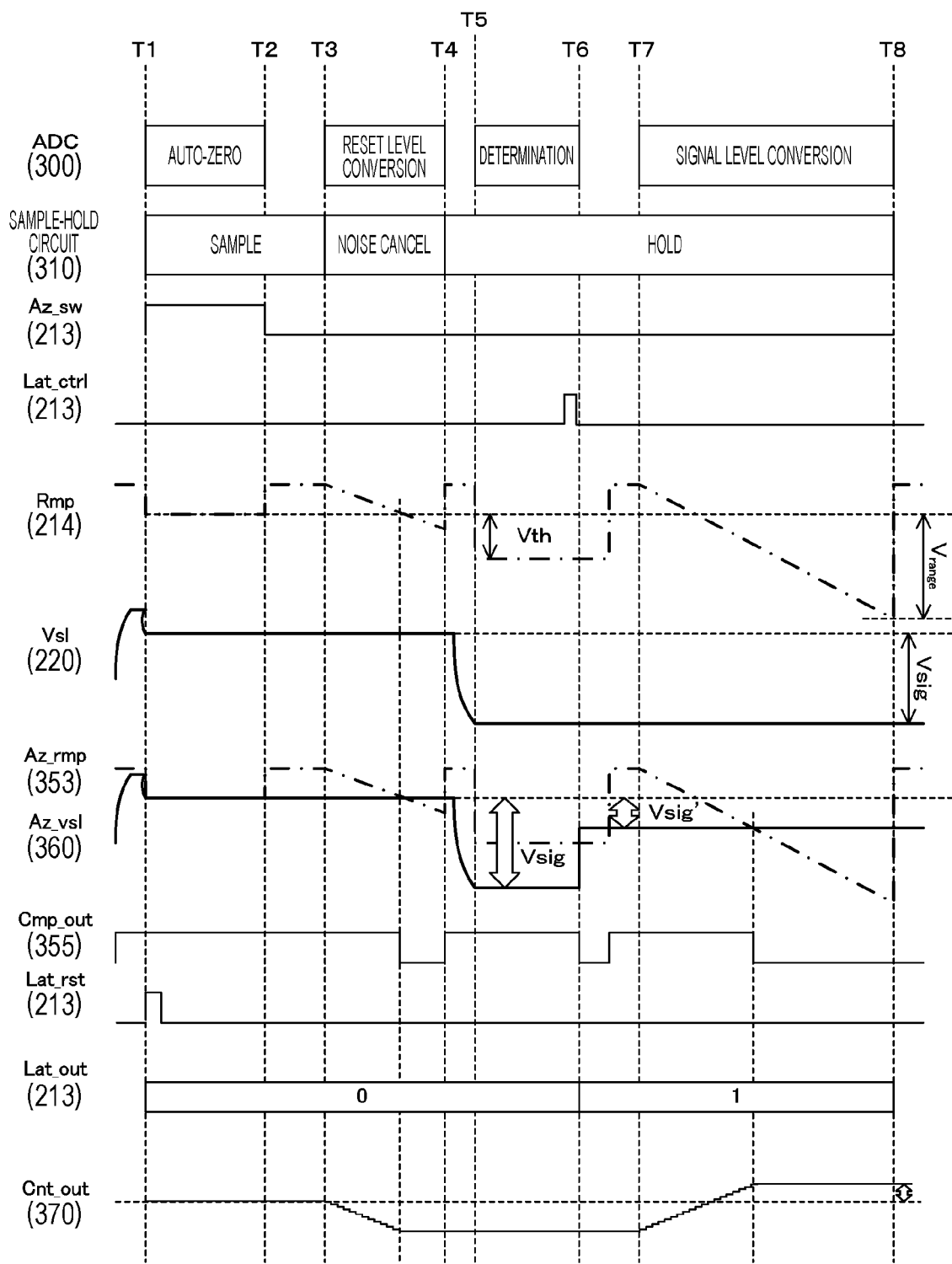
FIG. 11 is a timing chart illustrating an example of an operation of an ADC in a case where illuminance is high according to the first embodiment of the present technology.

FIG. 11 is a timing chart illustrating an example of the operation of the ADC 300 in a case where illuminance is high according to the first embodiment of the present technology. The operation of the ADC 300 from timing T1 to timing T6 in the drawing is similar to the case of low illuminance illustrated in FIG. 10.

Here, it is assumed that the incident light has a high illuminance such that the level of the pixel signal Vsig exceeds the threshold value Vth.

Since the level of the pixel signal Vsig exceeds the threshold value Vth, the comparator 350 outputs the high level comparison result Cmp_out at timing T6. Immediately before timing T6, the timing control circuit 213 transmits the high level control signal Lat_ctrl for a certain pulse period. Therefore, the high level comparison result Cmp_out is held in the latch circuit 354 as the determination result Lat_out.

After timing T6, the attenuation unit 360 switches the connection destination of the capacitance 362 to the output terminal of the sample-hold circuit 310 according to the high level determination result Lat_out. Therefore, the attenuation unit 360 can attenuate the pixel signal Vsig by the gain k illustrated in Formula 6.

After the determination operation is completed, the DAC 214 sets the level of the ramp signal Rmp to the reference level Vda2 again.

At timings T7 to T8 after the internal node of the ramp signal Rmp or the comparator 350 settles to a stable potential, the DAC 214 outputs the ramp signal Rmp that gradually decreases with lapse of time. On the other hand, the ADC 300 performs counting until the comparison result Cmp_out is inverted. Therefore, the AD conversion of the signal level is performed.

In general, in the single-slope ADC 300, the higher the level of the analog signal, the longer the time until the comparison result of the comparator 350 is inverted (that is, the time required for AD conversion). However, when the illuminance is high, the attenuation unit 360 attenuates the pixel signal Vsig having a relatively high level, so that the time required for the AD conversion of the signal level can be shortened. For example, by setting the gain k to ¼, the time required for the AD conversion can be shortened to ¼. Therefore, during the period of the AD conversion of one row, when AD conversion of high gradation (for example, 14 bits or more) dominated by the rate of signal level AD conversion time is performed, the AD conversion time can be effectively shortened.

Moreover, the attenuation of the pixel signal Vsig allows the range of the ramp signal Rmp to be narrower than that in the case where it is not attenuated. Therefore, the comparator 350 and the DAC 214 can be designed assuming a relatively low power supply voltage. Therefore, the power consumption of the comparator 350 and the DAC 214 can be reduced. Because of the synergistic effect of the effect of reducing the AD conversion time and the effect of reducing the power consumption of the comparator 350 and the DAC 214, the effect of reducing the power consumption of the ADC 300 required for one AD conversion is very large. Furthermore, the AD conversion speed can be improved by adding the sample-hold circuit 310 and improving the comparator 350 in a small scale. Since the DAC 214 and the counter 370 do not need to be improved, the circuit area overhead due to the improvement is small.

However, in a case where the pixel signal is attenuated by the gain k, it is necessary to multiply the digital signal by the reciprocal of the gain k and restore the original value in the digital signal processing unit 261 in the subsequent stage. Therefore, the ADC 300 outputs the determination result Lat_out to the digital signal processing unit 261. Note that in the case of low illuminance, the ADC 300 does not need to attenuate the pixel signal Vsig, and the digital signal processing unit 261 does not perform the multiplication processing on the digital signal.

The gain k for attenuation is determined by the ratio of the respective capacitance values of the capacitances 361 and 362 from Formula 6. On the basis of the gain k, the threshold value Vth for comparison with the pixel signal is set to a value that satisfies the following formula where $V_{range}$ is the voltage between the reference level Vda1 and the minimum value of the ramp signal Rmp during signal level conversion.

$$Vth = V_{range} \times k \hspace{2cm} \text{Formula 7}$$

The smaller the gain k, the shorter the AD conversion time of the signal level, and the faster the AD conversion speed. However, as the gain k is reduced, the threshold value Vth is also reduced according to Formula 7, and an error due to the switching operation of the selector 363 according to the determination result Lat_out may significantly appear in the small signal amount range. Therefore, the gain k is set to an optimum value in consideration of the balance between the AD conversion speed and the error characteristic.

[Operation Example of the Solid-State Imaging Element]

Figure 12:
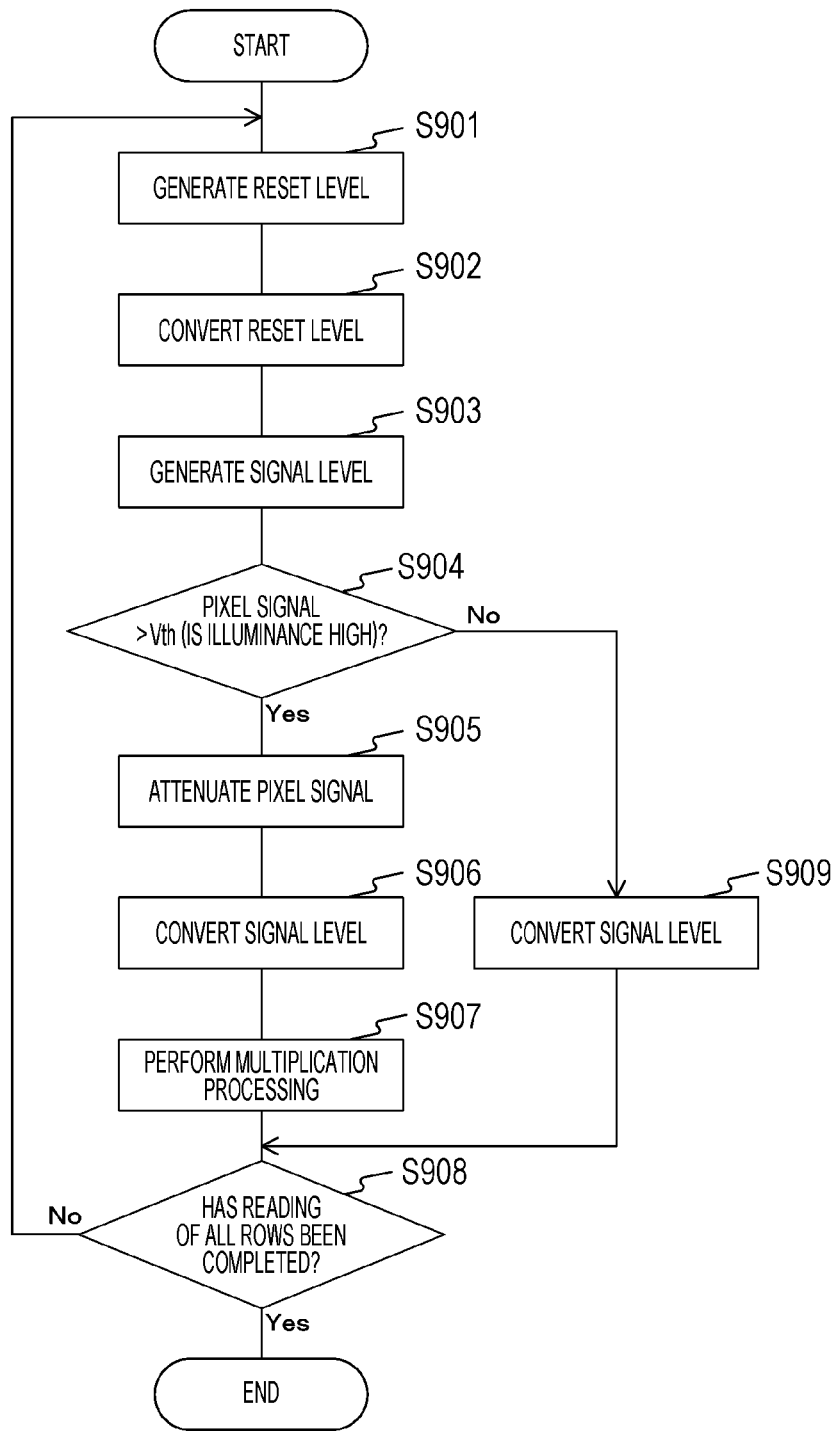
FIG. 12 is a flowchart illustrating an example of an operation of a solid-state imaging element according to the first embodiment of the present technology.

FIG. 12 is a flowchart illustrating an example of the operation of the solid-state imaging element 200 according to the first embodiment of the present technology. This operation is started, for example, when a predetermined application for capturing image data is executed.

The pixel 220 in a predetermined row in the solid-state imaging element 200 generates a reset level immediately before the end of exposure (step S901), and the ADC 300 performs the AD conversion on the reset level (step S902). Then, at the end of exposure, the pixel 220 generates a signal level (step S903), and the comparator 350 determines whether or not the pixel signal Vsig exceeds the threshold value Vth (step S904).

In a case where the pixel signal Vsig exceeds the threshold value Vth (step S904: Yes), the ADC 300 attenuates the pixel signal Vsig (step S905) and converts the signal level (step S906). Then, the digital signal processing unit 261 performs multiplication processing of multiplying the digital signal by the reciprocal of the gain k (step S907).

On the other hand, in a case where the pixel signal Vsig is less than or equal to the threshold value Vth (step S904: No), the ADC 300 converts the signal level (step S909).

After step S907 or S909, the solid-state imaging element 200 determines whether or not reading of all rows has been completed (step S908). In a case where reading of all rows has not been completed (step S908: No), the solid-state imaging element 200 changes a row to be read and repeatedly executes step S901 and subsequent steps. In a case where reading of all rows has been completed (step S908: Yes), the solid-state imaging element 200 ends an operation of capturing one piece of image data. In a case where a plurality of pieces of image data is continuously read, steps S901 to S909 are repeatedly executed.

As described above, according to the first embodiment of the present technology, in a case where the level of the pixel signal exceeds the predetermined threshold value, the attenuation unit 360 attenuates the pixel signal, so that the time until the comparison result of the comparator 350 is inverted can be shortened. Therefore, the speed of the AD conversion can be increased.

2. Second Embodiment

In the above-described first embodiment, asymmetric potentials (that is, the reset level and the signal level) are applied to the respective capacitances 361 and 362 when the illuminance is high, unlike when the illuminance is low. Therefore, the characteristic variation of the sample-hold circuit 310 that outputs the reset level remains without being canceled even by the CDS processing, and fixed pattern noise (FPN) may occur in the image data. The solid-state imaging element 200 according to the second embodiment is different from that according to the first embodiment in that fixed pattern noise is suppressed by correcting an offset component for each column.

Figure 13:
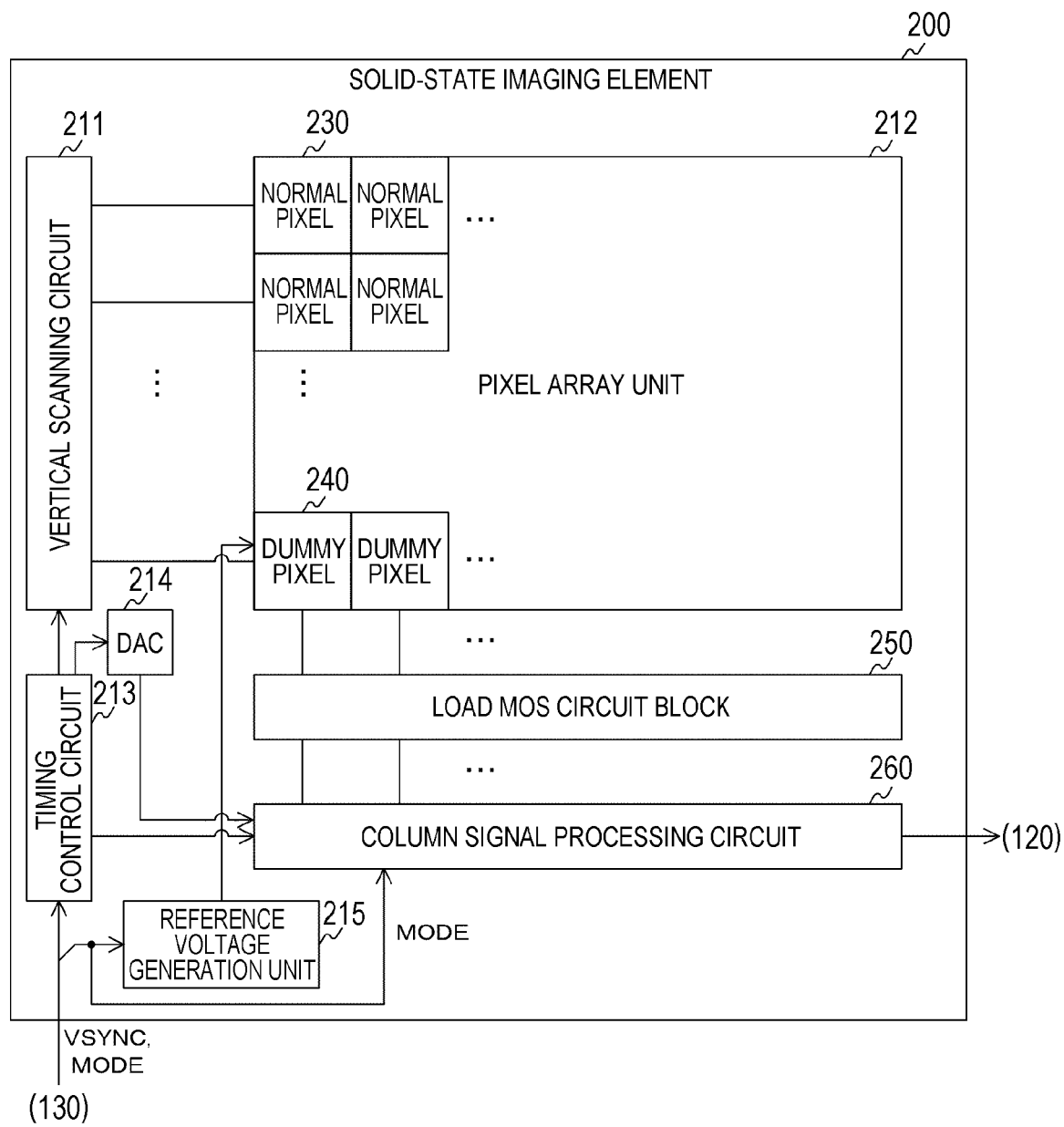
FIG. 13 is a block diagram illustrating a configuration example of a solid-state imaging element according to the second embodiment of the present technology.

FIG. 13 is a block diagram illustrating a configuration example of the solid-state imaging element 200 according to the second embodiment of the present technology. The solid-state imaging element 200 of the second embodiment is different from that of the first embodiment in that it further includes a reference voltage generation unit 215. Furthermore, a mode signal MODE from the imaging control unit 130 is further input to the solid-state imaging element 200.

Here, the mode signal MODE is a signal indicating any of various modes including a normal mode and an offset calculation mode. The normal mode is a mode for capturing image data, and the offset calculation mode is a mode for calculating an offset component.

Furthermore, in the pixel array unit 212 of the second embodiment, normal pixels 230 and at least one row of dummy pixels 240 are arranged.

The normal pixel 230 is a pixel that photoelectrically converts incident light to generate a pixel signal, and has a configuration similar to that of the pixel 220 of the first embodiment.

The dummy pixel 240 is to generate a signal according to a reference voltage from the reference voltage generation unit 215 as a dummy signal.

The reference voltage generation unit 215 generates a reference voltage and supplies it to the dummy pixels 240 of each column in the offset calculation mode.

Furthermore, the column signal processing circuit 260 calculates the offset component for each column on the basis of the dummy signal in the offset calculation mode. Furthermore, in the normal mode, the column signal processing circuit 260 corrects the digital signal by removing the calculated offset component for each column.

Figure 14:
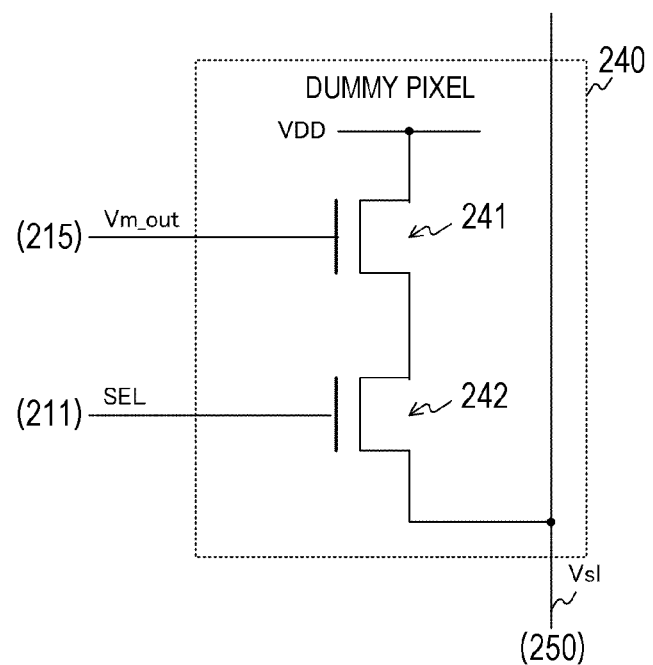
FIG. 14 is a circuit diagram illustrating a configuration example of a dummy pixel according to the second embodiment of the present technology.

FIG. 14 is a circuit diagram illustrating a configuration example of a dummy pixel 240 according to the second embodiment of the present technology. The dummy pixel 240 includes an amplification transistor 241 and a selection transistor 242.

The amplification transistor 241 amplifies a reference voltage Vm_out from the reference voltage generation unit 215. The selection transistor 242 outputs the signal of the amplified reference voltage Vm_out as a dummy signal through the vertical signal line Vsl in accordance with a selection signal SEL from the vertical scanning circuit 211.

Figure 15:
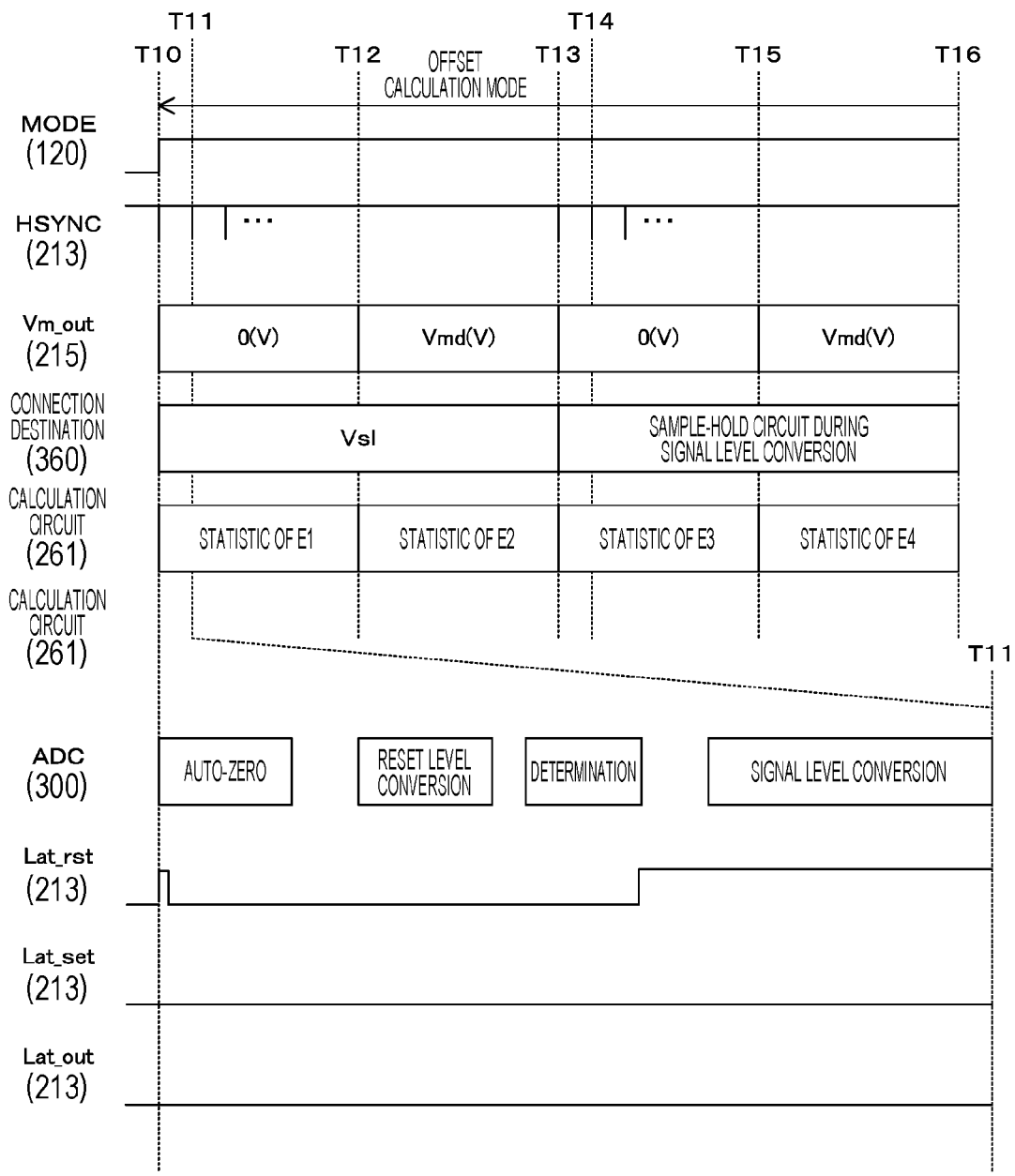
FIG. 15 is a timing chart illustrating an example of an operation of an ADC when performing statistical processing by connecting a vertical signal line according to the second embodiment of the present technology.

FIG. 15 is a timing chart illustrating an example of the operation of the ADC 300 when performing statistical processing by connecting the vertical signal line Vsl according to the second embodiment of the present technology.

In the offset calculation mode after timing T10, the vertical scanning circuit 211 does not drive the row of the normal pixels 230, but drives the row of the dummy pixels 240 by the selection signal SEL. Furthermore, the reference voltage generation unit 215 can control the amplitude of the vertical signal line Vsl to an arbitrary value by adjusting the reference voltage Vm_out to either "0" volt (V) or Vmd volt (V). For example, the reference voltage Vm_out of "0" volt (V) is supplied in each of the periods of timings T10 to T12 and timings T13 to T15. Furthermore, the reference voltage Vm_out of Vmd volt (V) is supplied in each of the periods of timings T12 to T13 and timings T15 to T16. The value of the amplitude of the reference voltage (that is, Vmd) is set near the threshold value Vth.

Furthermore, the timing control circuit 213 supplies the control signal Lat_rst for the pulse period at timing T10, and sets the control signal Lat_set to a low level at timings T10 to T11. The determination result Lat_out is fixed to the logical value "0". Therefore, the capacitance 362 is connected to the vertical signal line Vsl, and the dummy signal is output without being attenuated.

On the other hand, after timing T13, the timing control circuit 213 fixes the determination result Lat_out of the period to the logical value "1" by setting the Lat_set to the logical value "1" during the AD conversion of the signal level. Therefore, the capacitance 362 is connected to the sample-hold circuit 310 during the AD conversion of the signal level, and the dummy signal is attenuated.

There are four combinations as to whether or not the connection destination is the sample-hold circuit 310 (that is, attenuation of the dummy signal) and whether or not the reference voltage is "0" or "Vmd". In each of these combinations, a plurality of dummy signals is generated for each column. For example, the vertical scanning circuit 211 selects the row of the dummy pixels 240 multiple times in synchronization with a horizontal synchronization signal HSYNC during the period of timings T10 to T12. Here, the horizontal synchronization signal HSYNC is a cyclic signal that instructs the timing of reading a row, and has a higher frequency than a vertical synchronization signal VSYNC. Furthermore, similarly, in each of the period of timings T12 to T13, the period of timings T13 to T15, and the period of timings T15 to T16, the row of the dummy pixels 240 is selected multiple times. In these four periods, the digital signal processing unit 261 obtains an average value of the dummy signal for each column.

Average values of the i-th (i is an integer) column of each of the period of timings T10 to T12 and the period of timings T12 to T13 are $E1(i)$ and $E2(i)$. Furthermore, the average values of the i-th column of each of the period of timings T13 to T15 and the period of timings T15 to T16 are $E3(i)$ and $E4(i)$. The average value $E1(i)$ is an amount of statistics in a case where the reference voltage is "0" and the dummy signal is not attenuated. The average value $E2(i)$ is an amount of statistics in a case where the reference voltage is "Vmd" and the dummy signal is not attenuated. Furthermore, the average value $E3(i)$ is an amount of statistics in a case where the reference voltage is "0" and the dummy signal is attenuated. The average value $E4(i)$ is an amount of statistics in a case where the reference voltage is "Vmd" and the dummy signal is attenuated. By obtaining the average value in this way, it is possible to reduce the influence of random noise that occurs when the offset component is computed.

Within the period of the horizontal synchronization signal HSYNC at timings T10 to T11, the ADC 300 performs the AD conversion on the reset level and the signal level. Furthermore, the timing control circuit 213 supplies the control signal Lat_rst for the pulse period at timing T10, and sets the control signal Lat_set to a low level at timings T10 to T11. Therefore, the determination result Lat_out is fixed to the logical value "0". It is similar to each cycle of the horizontal synchronization signal HSYNC from timing T11 to timing T13.

Figure 16:
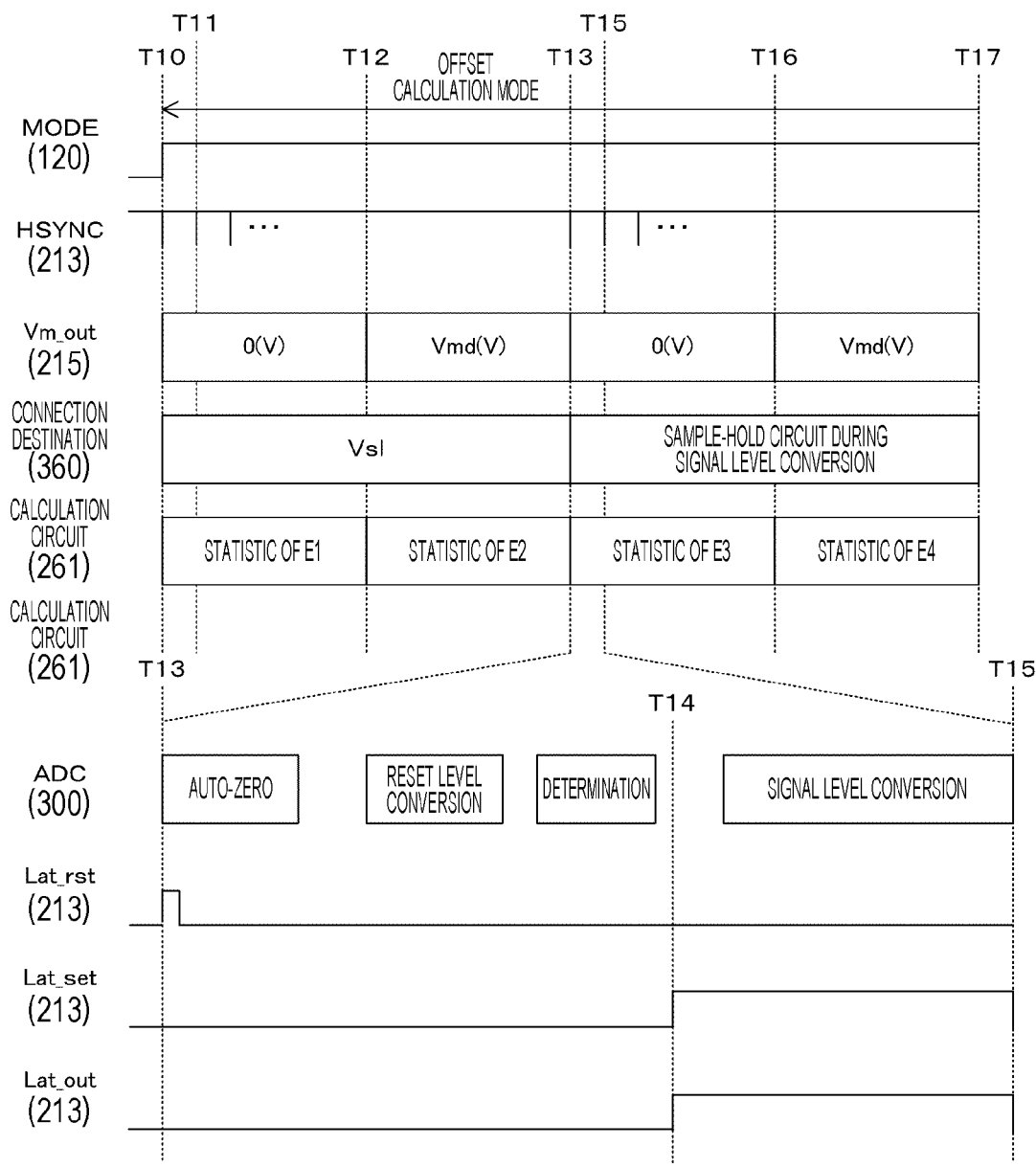
FIG. 16 is a timing chart illustrating an example of an operation of an ADC when performing statistical processing by connecting a sample-hold circuit according to the second embodiment of the present technology.

FIG. 16 is a timing chart illustrating an example of the operation of the ADC 300 when performing statistical processing by connecting the sample-hold circuit 310 according to the second embodiment of the present technology.

Within the cycle of the vertical synchronization signal VSYNC at timings T13 to T14, the ADC 300 performs the AD conversion on the reset level and the signal level. Furthermore, the timing control circuit 213 supplies the control signal Lat_rst for the pulse period at timing T13, and sets the control signal Lat_set to a high level at timings T14 to T15 after the determination operation. Therefore, the determination result Lat_out of the signal level in the AD conversion period is fixed to the logical value "1". It is similar to each cycle of the vertical synchronization signal VSYNC from timing T14 to timing T16.

Figure 17:
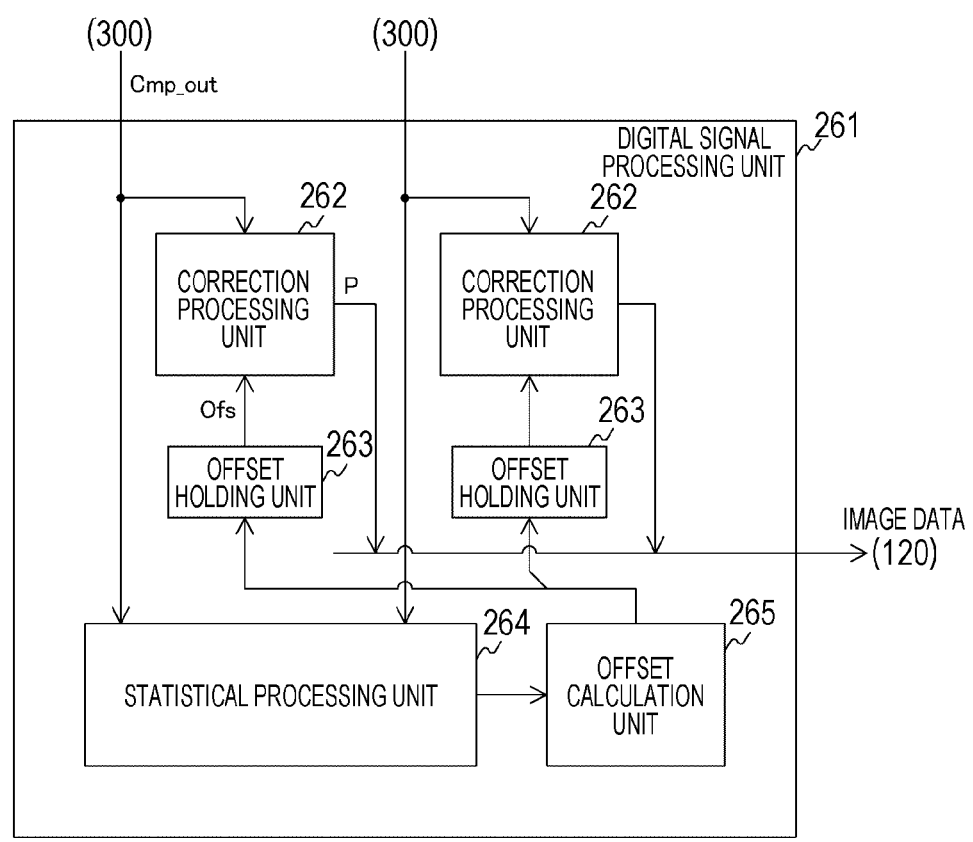
FIG. 17 is a block diagram illustrating a configuration example of a digital signal processing unit according to the second embodiment of the present technology.

FIG. 17 is a block diagram illustrating a configuration example of a digital signal processing unit 261 according to the second embodiment of the present technology. The digital signal processing unit 261 includes a correction processing unit 262 and an offset holding unit 263 for each column. Furthermore, the digital signal processing unit 261 includes a statistical processing unit 264 and an offset calculation unit 265.

In the offset calculation mode, the statistical processing unit 264 calculates the average values E1(i) to E4(i) for each column using the dummy signal. In a case where the number of columns is I, the average values E1(i) to E4(i) are calculated by I.

Note that although the statistical processing unit 264 calculates the average value, it can also calculate an amount of statistics other than the average value, such as a median value or a total amount.

The offset calculation unit 265 calculates an offset component. The attenuation rate (that is, gain) of the pixel signal depends on the capacitance value of the capacitances 361 and 362 and the parasitic capacitance of the node of the capacitances on the comparison device 355 side, and it is expected that the values fluctuate between columns and between chips due to variations in manufacture. The offset calculation unit 265 computes the gain k(i) for each column, for example, by the following formula.

$$k(i)=\{E2(i)-E1(i)\}/\{E4(i)-E3(i)\} \quad \text{Formula 8}$$

Because of the characteristics of the sample-hold circuit 310 for each column, an offset occurs between the sampled and held potential and the potential of the original vertical signal line Vsl, and the offset amount differs for each column. The offset calculation unit 265 calculates an offset component Ofs(i) by the following formula using the gain k(i) obtained by Formula 8.

$$Ofs(i)=\{E3(i)-E1(i)\}/k(i) \quad \text{Formula 9}$$

The offset component Ofs(i) and the gain k(i) of the i-th column are held in the offset holding unit 263 corresponding to that column. A static random access memory (SRAM) or a register is used as the offset holding unit 263.

The correction processing unit 262 performs correction by removing the offset component Ofs(i) in the normal mode. At the time of high illuminance where the determination result Lat_out is "1", the value of the corrected pixel data P(i) is represented, for example, by the following formula.

$$P(i)=\{Cnt\_out(i)-Ofs(i)\}\times\{1/k(i)\} \quad \text{Formula 10}$$

In particular, since the signal of high illuminance contains a lot of optical short-circuit noise, the degree of allowable FPN is less than that of the signal of low illuminance. Therefore, in a case where the illuminance is high, the correction accuracy may be relatively low, and the time for the offset calculation mode for calibration may be short.

FIG. 18 is a diagram illustrating an example of the operation of the digital signal processing unit 261 according to the second embodiment of the present technology. In a case where the mode signal MODE is set to the normal mode and the illuminance is low where the determination result Lat_out is "0", the digital signal processing unit 261 outputs the digital signal Cnt_out(i) as the pixel data P(i) as it is.

On the other hand, in a case where the mode signal MODE is set to the normal mode and the illuminance is high where the determination result Lat_out is "1", the digital signal processing unit 261 corrects the digital signal Cnt_out(i) by Formula 10 and outputs the signal as the pixel data P(i).

Furthermore, in a case where the mode signal MODE is set to the offset calculation mode, the digital signal processing unit 261 calculates the offset component Ofs(i) for each column according to Formulae 8 and 9.

As described above, according to the second embodiment of the present technology, since the digital signal processing unit 261 obtains the offset component for each column using the dummy signal and performs correction for each column, and therefore the fixed pattern noise due to the offset component can be reduced.

[Variations]

In the above-described second embodiment, the gain k is set to the optimum value on the basis of the ratio of the capacitance values of the capacitances 361 and 362. However, the optimum value may vary from column to column or from chip to chip due to variations in manufacture and the like. The solid-state imaging element 200 of the variation of the second embodiment is different from that of the first embodiment in that the capacitance value of the combined capacitance is adjusted.

Figure 19:
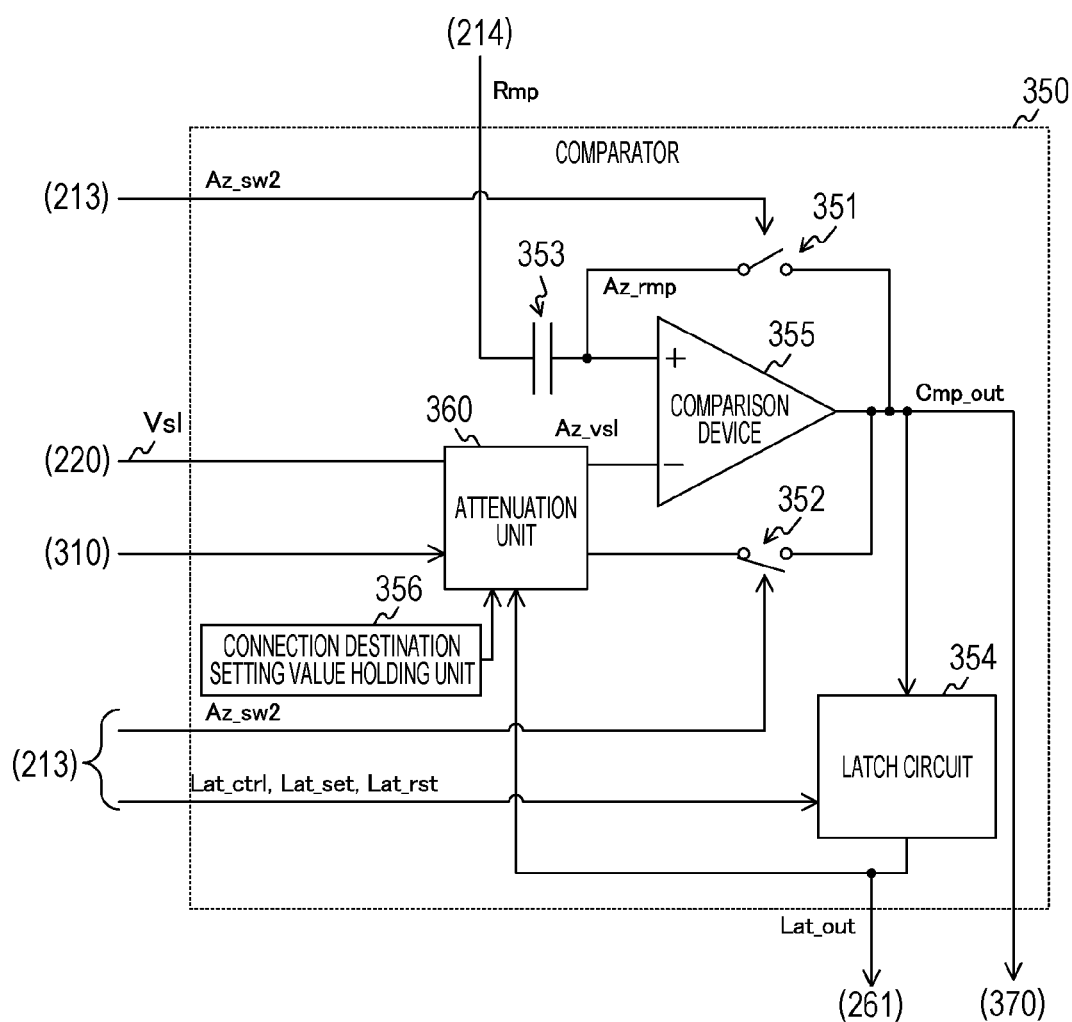
FIG. 19 is a circuit diagram illustrating a configuration example of a comparator according to a variation of the second embodiment of the present technology.

FIG. 19 is a circuit diagram illustrating a configuration example of the comparator 350 according to the variation of the second embodiment of the present technology. The comparator 350 of the variation of the second embodiment differs from that of the second embodiment in that it further includes a connection destination setting value holding unit 356.

The connection destination setting value holding unit 356 holds a setting value indicating the connection destination of the capacitance in the attenuation unit 360. SRAM, a register, or the like is used as the connection destination setting value holding unit 356.

Figure 20:
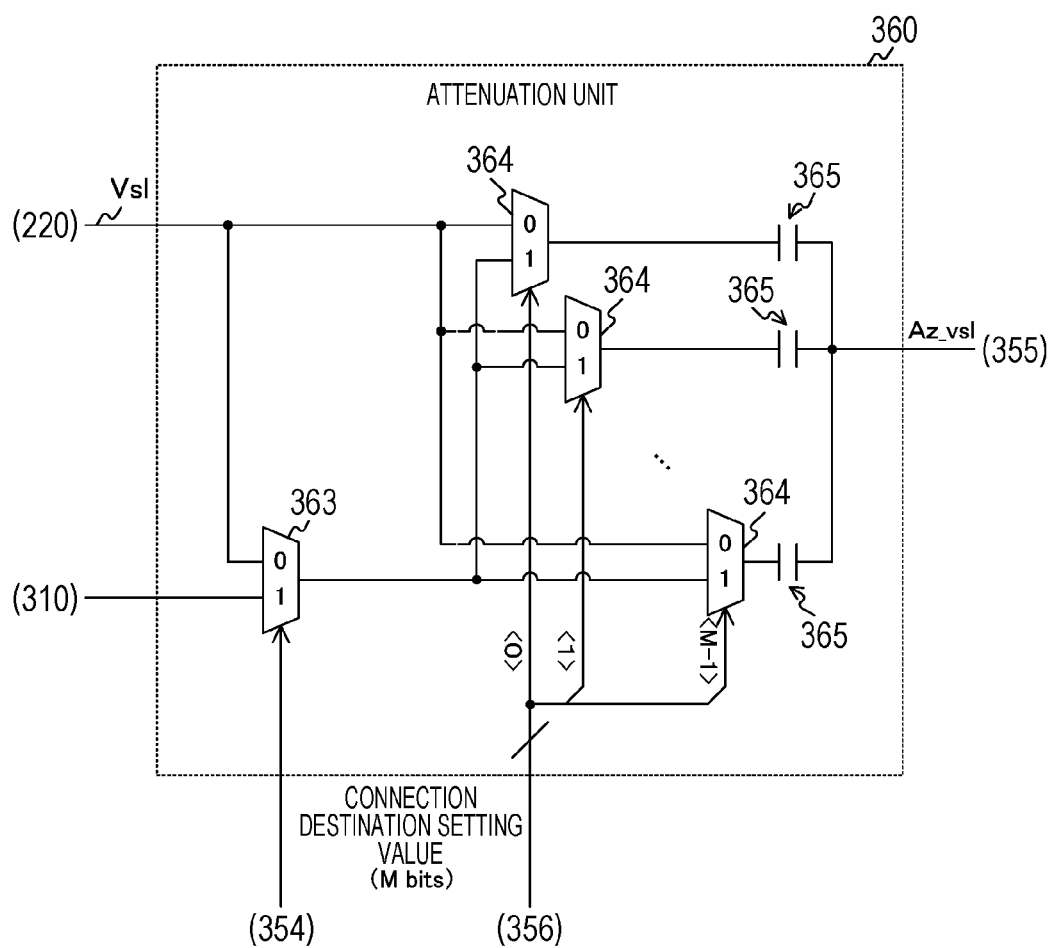
FIG. 20 is a circuit diagram illustrating a configuration example of an attenuation unit according to a variation of the second embodiment of the present technology.

FIG. 20 is a circuit diagram illustrating a configuration example of the attenuation unit 360 according to the variation of the second embodiment of the present technology. The attenuation unit 360 of the variation of the second embodiment is different from that of the second embodiment in that it includes M (M is an integer) selectors 364 and M capacitances 365 instead of the capacitances 361 and 362.

The M capacitances 365 are connected in parallel to the inverting input terminal of the comparison device 355. Furthermore, the connection destination setting value holding unit 356 holds an M-bit setting value. An m-th (m is an integer from 0 to M−1) bit of this setting value is input to an m-th selector 364.

The selector 364 connects either the vertical signal line Vsl or the output terminal of the selector 363 to the corresponding capacitance 365 according to the corresponding bit of the setting value. For example, the m-th selector 364 connects the vertical signal line Vsl to the corresponding capacitance 365 in a case where the m-th bit has the logical value "0" and connects the output terminal of the selector 363 to the capacitance 365 in a case where the m-th bit has the logical value "1".

Some of the M capacitances 365 are connected to the vertical signal line Vsl by the M selectors 364, and the rest is connected to the output terminal of the selector 363. The combined capacitance of the capacitances 365 connected to the vertical signal line Vsl corresponds to $C_1$ in Formula 6, and the combined capacitance of the remaining capacitances 365 corresponds to $C_2$. Note that the selector 363 is an example of the first selector described in the claims, and the selector 364 is an example of the second selector described in the claims.

By changing the M-bit setting value as described above, it is possible to control the ratio of $C_1$ and $C_2$ in Formula 6 and adjust the gain k to an appropriate value.

Note that the configuration illustrated in the drawing can be applied to the attenuation unit 360 of the first embodiment.

As described above, since the attenuation unit 360 according to the second embodiment of the present technology changes the connection destination of each of the M capacitances 365 by the setting value, the ratio of the capacitance values $C_1$ and $C_2$ can be controlled by the setting value to adjust the gain k to an appropriate value.

3. Third Embodiment

In the above-described first embodiment, the pixel 220 generates a pixel signal with a constant charge-voltage conversion efficiency, but from the viewpoint of reducing noise during low illuminance, it is desirable that two different charge-voltage conversion efficiencies be used to generate a pixel signal. The pixel 220 of the third embodiment differs from that of the first embodiment in that a pixel signal is generated with each of the two different charge-voltage conversion efficiencies.

Figure 21:
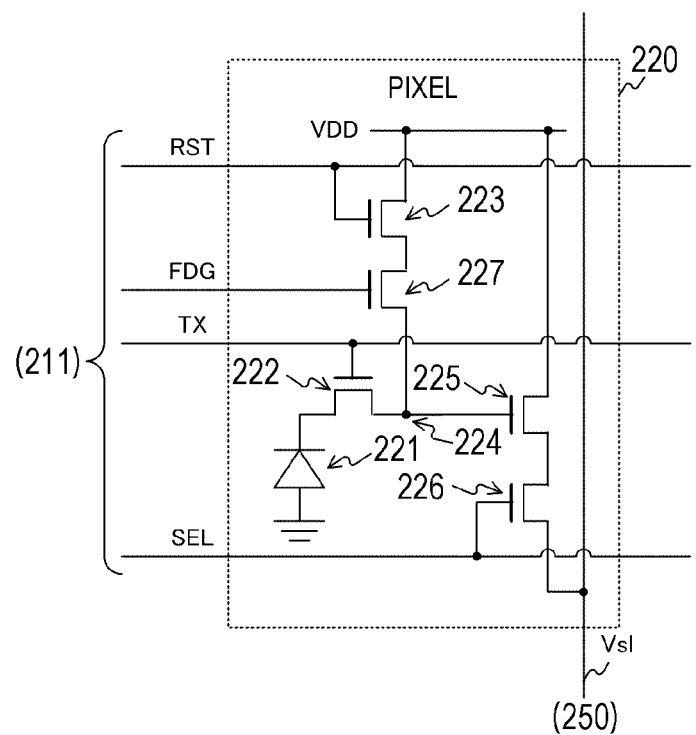
FIG. 21 is a circuit diagram illustrating a configuration example of a pixel according to the third embodiment of the present technology.

FIG. 21 is a circuit diagram illustrating a configuration example of the pixel 220 according to the third embodiment of the present technology. The pixel 220 of the third embodiment differs from that of the first embodiment in that it further includes a conversion efficiency control transistor 227. As the conversion efficiency control transistor 227, for example, an N-type MOS transistor is used.

The reset transistor 223 and the conversion efficiency control transistor 227 are connected in series between the terminal of a power supply voltage VDD and the floating diffusion layer 224. Furthermore, a control signal FDG from the vertical scanning circuit 211 is input to the gate of the conversion efficiency control transistor 227.

The vertical scanning circuit 211 supplies a high level control signal FDG for a pulse period immediately after reset, and controls the control signal to a low level thereafter so that the pixel 220 can generate a pixel signal with a charge-voltage conversion efficiency higher than a predetermined value. On the other hand, the vertical scanning circuit 211 constantly supplies a high level control signal FDG so that the pixel 220 can generate a pixel signal with a charge-voltage conversion efficiency lower than a predetermined value. Hereinafter, the higher charge-voltage conversion efficiency is simply referred to as the "high conversion efficiency", and the lower charge-voltage conversion efficiency is simply referred to as the "low conversion efficiency".

Figure 22:
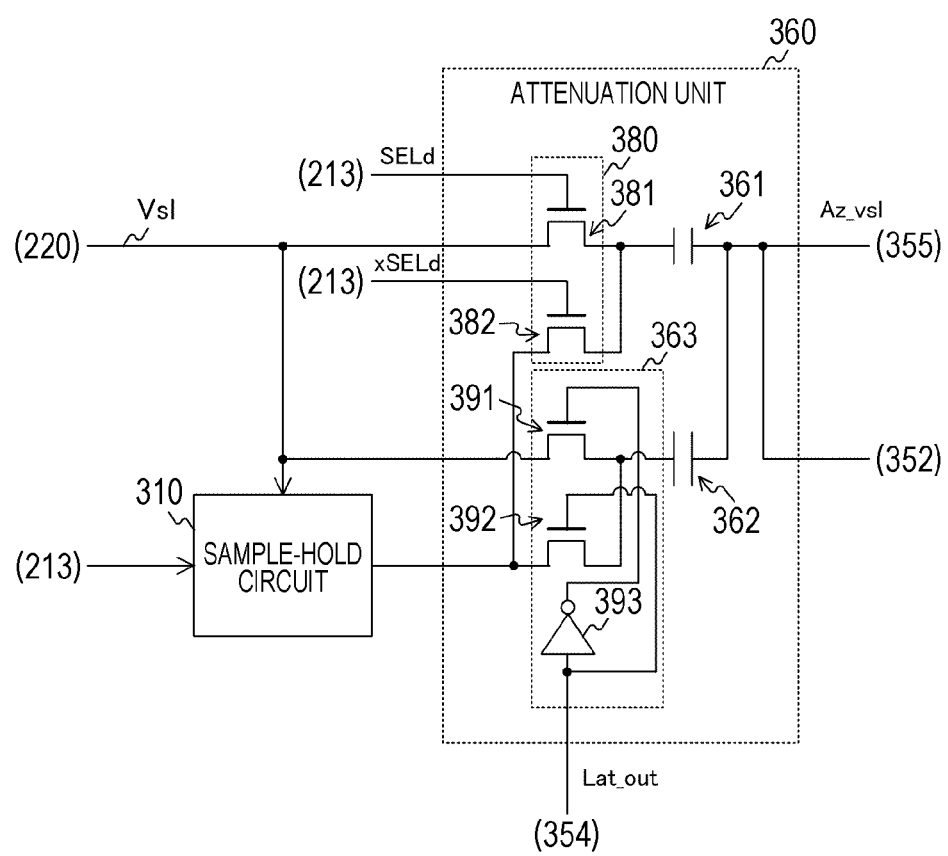
FIG. 22 is a circuit diagram illustrating a configuration example of an attenuation unit according to the third embodiment of the present technology.

FIG. 22 is a circuit diagram illustrating a configuration example of the attenuation unit 360 according to the third embodiment of the present technology. The attenuation unit 360 of the third embodiment differs from that of the first embodiment in that it further includes a selector 380. N-type transistors 381 and 382 are arranged in the selector 380. Furthermore, for example, N transistors 391 and 392 and an inverter 393 are arranged in the selector 363. For example, an MOS transistor is used as the N-type transistors 381 and 382 and the N-type transistors 391 and 392. Note that the selector 380 is an example of the first capacitance-side selector described in the claims, and the selector 363 is an example of the second capacitance-side selector described in the claims.

The N-type transistor 381 connects the vertical signal line Vsl to the capacitance 361 according to a selection signal SELd from the timing control circuit 213. The N-type transistor 382 connects the output terminal of the sample-hold circuit 310 to the capacitance 361 according to a selection signal xSELd from the timing control circuit 213. The selection signal xSELd is a signal obtained by inverting the selection signal SELd. With this configuration, the selector 380 connects the vertical signal line Vsl to the capacitance 361 when the selection signal SELd is at a high level, and connects the output terminal of the sample-hold circuit 310 to the capacitance 361 when the selection signal SELd is at a low level.

Furthermore, the inverter 393 inverts the determination result Lat_out from the latch circuit 354 and supplies the inverted result to the gate of the N-type transistor 391. The N-type transistor 391 connects the vertical signal line Vsl to the capacitance 362 according to the inverted signal of the determination result Lat_out. The N-type transistor 392 connects the output terminal of the sample-hold circuit 310 to the capacitance 362 according to the determination result Lat_out.

FIG. 23 is a timing chart illustrating an example of the operation of the ADC in each of the normal drive mode and the dual gain drive mode according to the third embodiment of the present technology. The imaging control unit 130 supplies a mode signal DG indicating either the normal drive mode or the dual gain drive mode. Here, the normal drive mode is a mode in which the pixel 220 generates a pixel signal only with one of the high conversion efficiency and the low conversion efficiency. On the other hand, the dual gain drive mode is a mode in which the pixel 220 generates a pixel signal with both the high conversion efficiency and the low conversion efficiency.

In the normal drive mode as illustrated in a of the drawing, the ADC 300 performs the AD conversion of the reset level and the signal level of the pixel signal once for each row in synchronization with the horizontal synchronization signal HSYNC. On the other hand, in the dual gain drive mode as illustrated in b of the drawing, the pixel 220 generates a pixel signal with the high conversion efficiency and then generates a pixel signal with the low conversion efficiency. Furthermore, the ADC 300 performs the AD conversion on the reset level and the signal level of the pixel signal with the high conversion efficiency for each row and then performs the AD conversion on the reset level and the signal level of the pixel signal with the low conversion efficiency in synchronization with the horizontal synchronization signal HSYNC.

Furthermore, in the dual gain mode, the digital signal processing unit 261 in the latter stage of the ADC 300 corrects the digital signal Cnt_out with the high conversion efficiency as necessary in a case where the digital signal Cnt_out is less than a full code, and outputs the signal as the signal of the pixel. On the other hand, in a case where the digital signal Cnt_out with the high conversion efficiency is a full code, the digital signal processing unit 261 corrects the digital signal Cnt_out with the low conversion efficiency as necessary, and outputs the signal as the signal of the pixel. Therefore, the dynamic range can be expanded and the noise of the low illuminance signal can be reduced. However, in the dual gain drive mode, the read speed is reduced and the power consumption is increased as compared with the normal drive mode. The imaging control unit 130 sets the dual gain drive mode depending on the situation or the user's manipulation.

Figure 24:
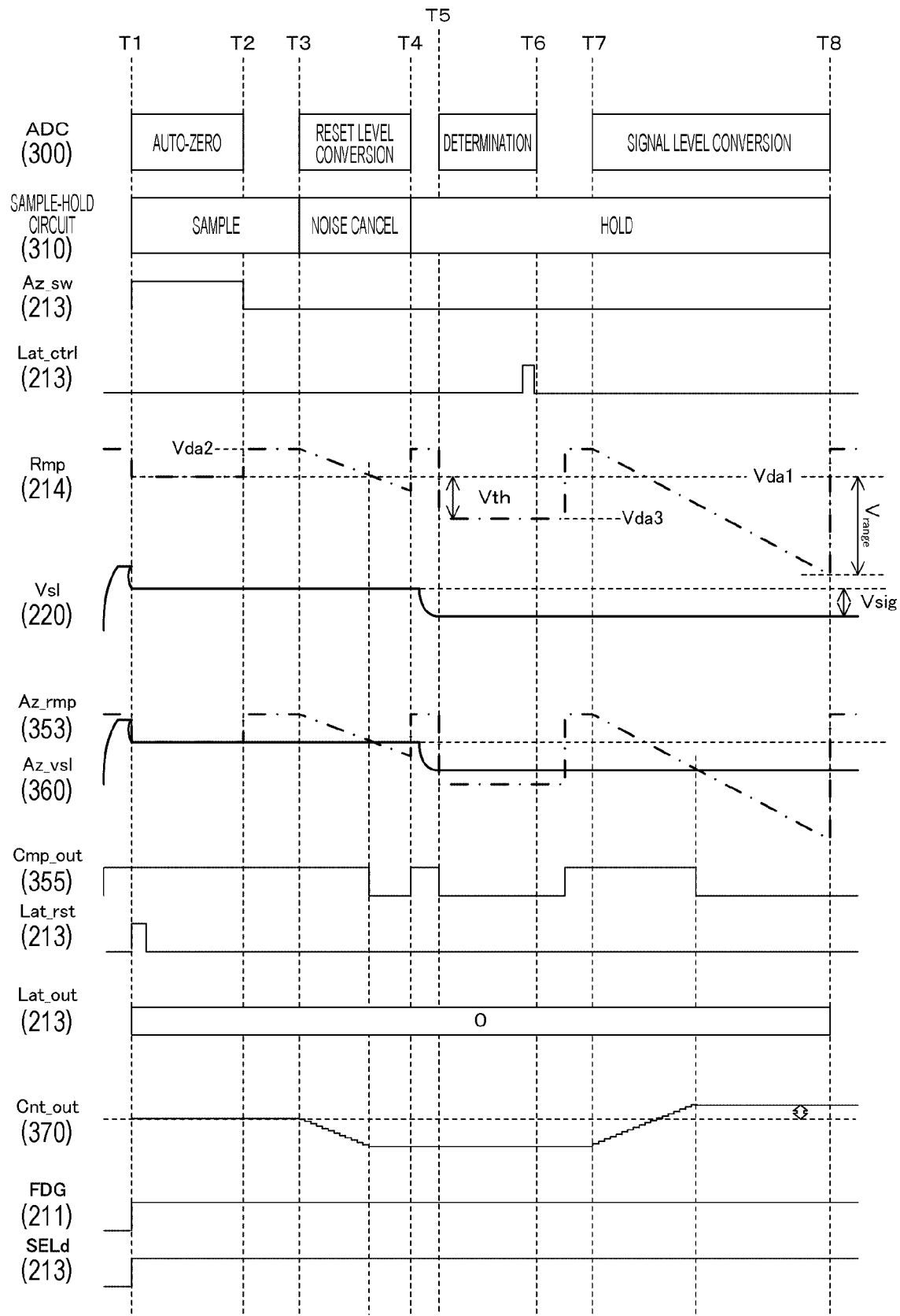
FIG. 24 is a timing chart illustrating an example of an operation of an ADC in a case where illuminance is low in the normal drive mode according to the third embodiment of the present technology.

FIG. 24 is a timing chart illustrating an example of the operation of the ADC in a case where illuminance is low in the normal drive mode according to the third embodiment of the present technology. Furthermore, FIG. 25 is a timing chart illustrating an example of the operation of the ADC in a case where illuminance is high in the normal drive mode according to the third embodiment of the present technology.

Figure 25:
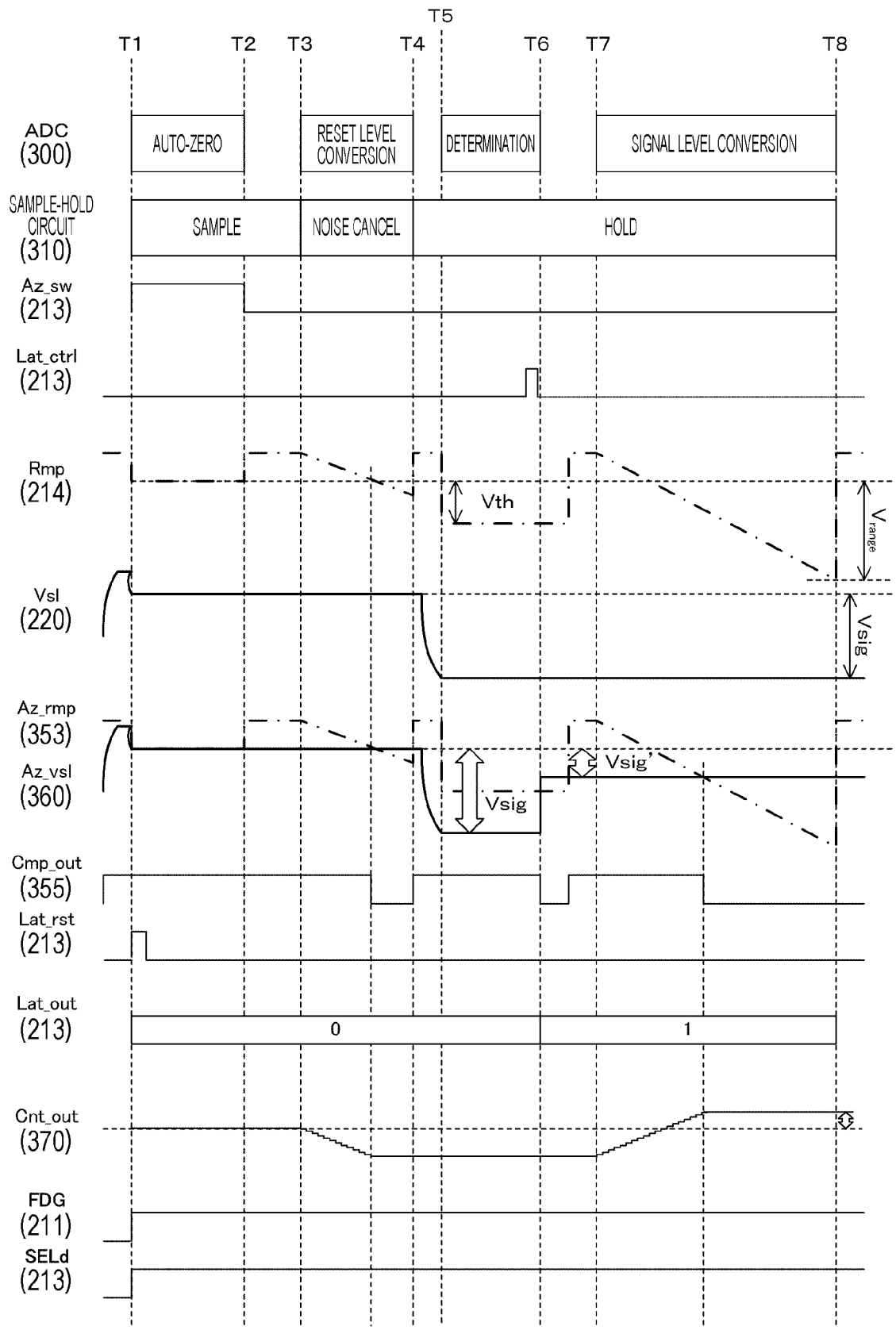
FIG. 25 is a timing chart illustrating an example of an operation of an ADC in a case where illuminance is high in the normal drive mode according to the third embodiment of the present technology.

In FIGS. 24 and 25, the description of the control signal FDG and the selection signal SELd is added in comparison with the first embodiment illustrated in FIGS. 10 and 11.

In the normal drive mode, the vertical scanning circuit 211, for example, supplies a high level control signal FDG to generate a pixel signal with the low conversion efficiency. Furthermore, in the normal drive mode, the timing control circuit 213 supplies a high level selection signal SELd. Note that, in the normal drive mode, the vertical scanning circuit 211 may set the control signal FDG to a high level for a pulse period immediately after the reset and then to a low level thereafter to generate a pixel signal with the high conversion efficiency.

Figure 26:
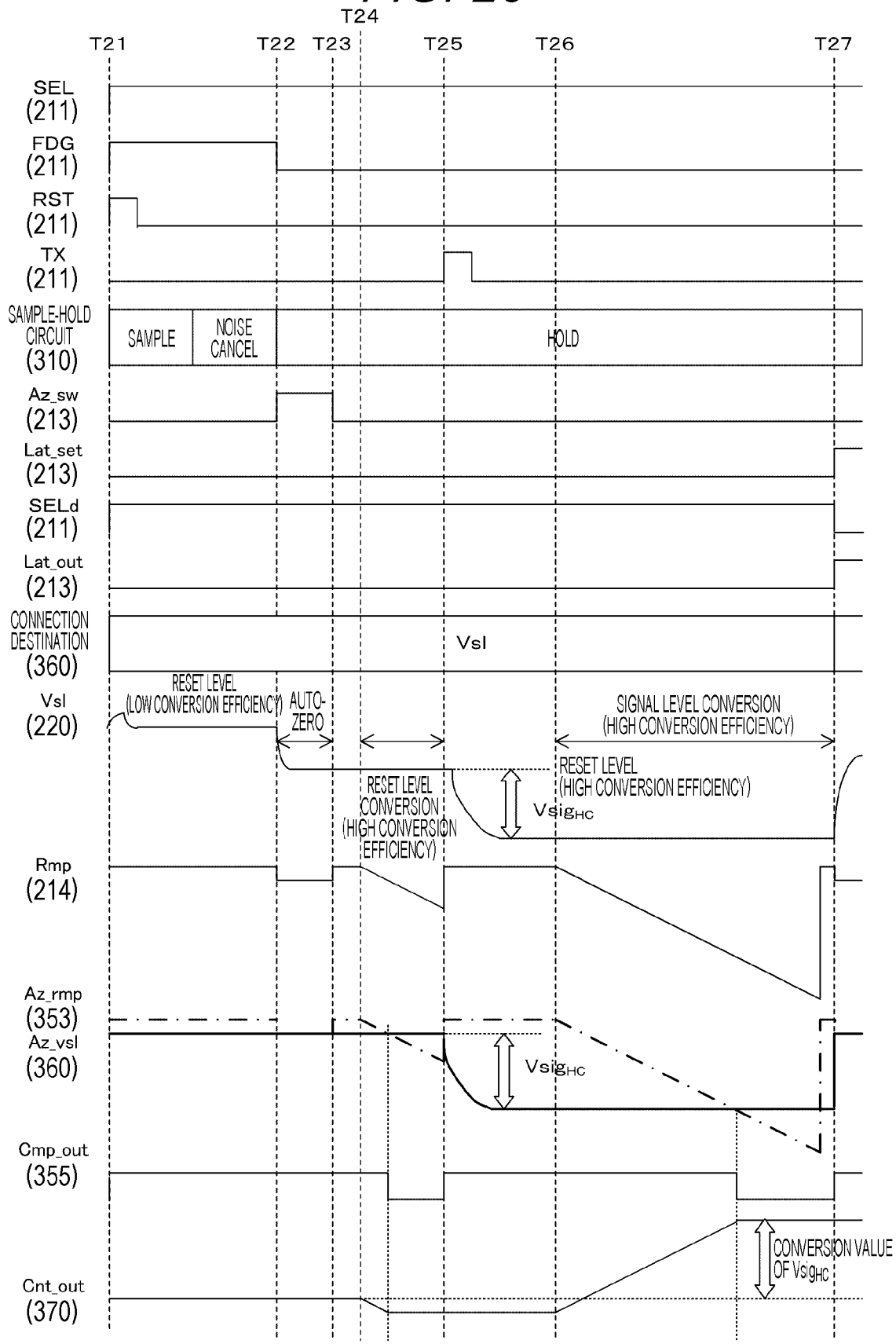
FIG. 26 is a timing chart illustrating an example of an operation of an ADC that performs AD conversion of a pixel signal with high conversion efficiency in the dual gain drive mode according to the third embodiment of the present technology.

FIG. 26 is a timing chart illustrating an example of the operation of the ADC 300 that performs the AD conversion of a pixel signal with the high conversion efficiency in the dual gain drive mode according to the third embodiment of the present technology.

In the pulse period of timing T21 to T22, the vertical scanning circuit 211 supplies a high level control signal FDG and sets the control signal FDG to a low level at timing T22. The potential of the vertical signal line Vsl during this period corresponds to the reset level with the low conversion efficiency. Then, after timing T22, the pixel signal is generated with the high conversion efficiency.

At timings T22 to T23, the ADC 300 enters the auto-zero state, and at timings T24 to T25, performs the AD conversion on the reset level with the high conversion efficiency. Furthermore, at timings T25 to T26, the potential of the vertical signal line Vsl changes to a signal level with the high conversion efficiency, and at timings T26 to T27, the ADC 300 performs the AD conversion on the signal level.

Figure 27:
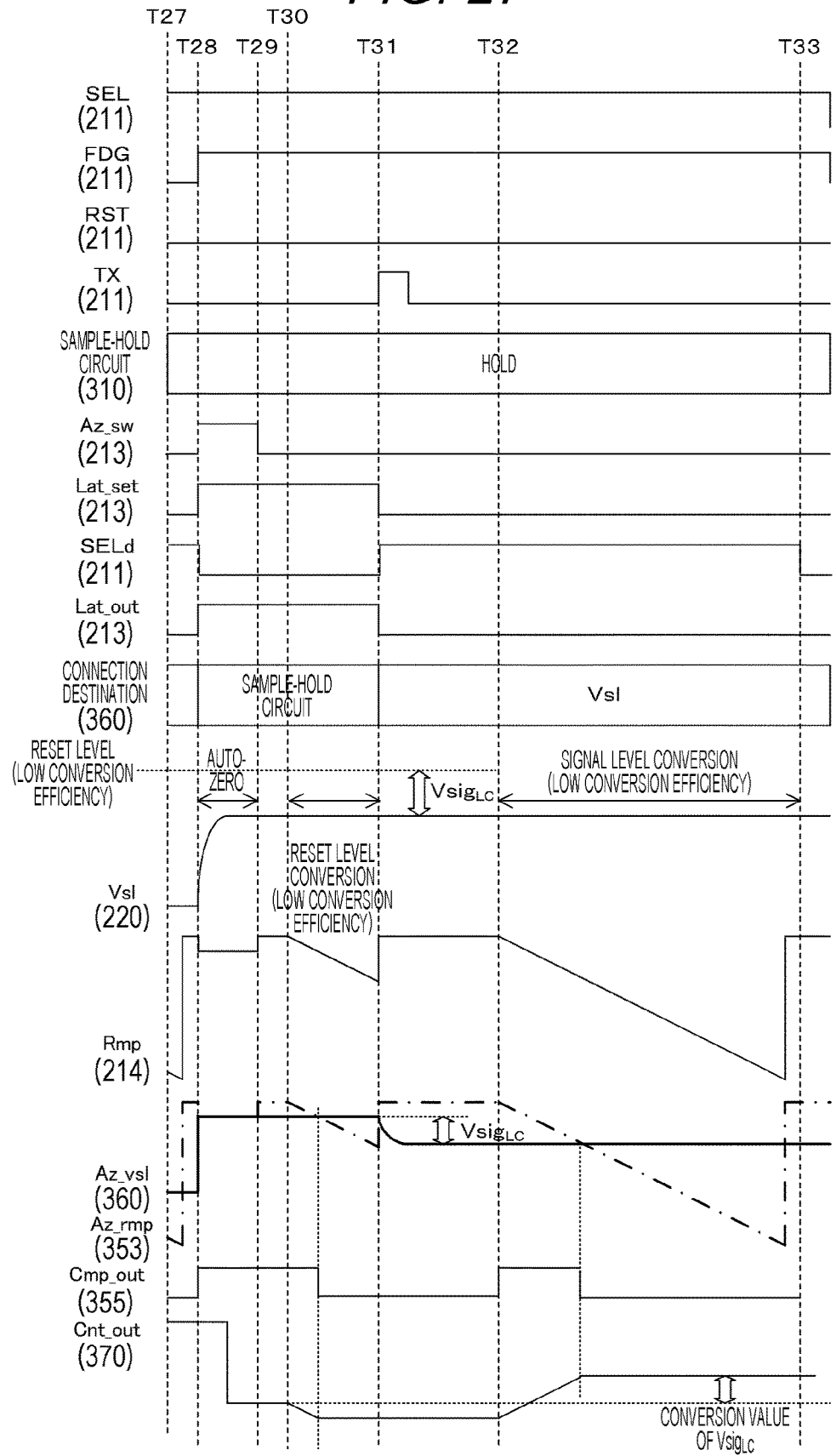
FIG. 27 is a timing chart illustrating an example of an operation of an ADC that performs AD conversion of a pixel signal with low conversion efficiency in the dual gain drive mode according to the third embodiment of the present technology.

FIG. 27 is a timing chart illustrating an example of the operation of the ADC 300 that performs the AD conversion of a pixel signal with the low conversion efficiency in the dual gain drive mode according to the third embodiment of the present technology.

At timing T28, the vertical scanning circuit 211 sets the control signal FDG to a high level. Therefore, after timing T28, the pixel signal is generated with the low conversion efficiency.

At timings T28 to T29, the ADC 300 enters the auto-zero state, and at timings T30 to T31, performs the AD conversion on the reset level with the low conversion efficiency. Furthermore, at timings T31 to T32, the potential of the vertical signal line Vsl changes to a signal level with the low conversion efficiency, and at timings T32 to T33, the ADC 300 performs the AD conversion on the signal level. With the control illustrated in FIGS. 26 and 27, the pixel signal is not attenuated in the dual gain drive mode.

FIG. 28 is a graph illustrating an example of the relationship between pixel signal level, AD conversion value, and signal charge amount according to the third embodiment of the present technology. In the drawing, a is a graph illustrating an example of the relationship between the level of a pixel signal and a signal charge amount. In a of the drawing, the vertical axis is pixel signal level, and the horizontal axis is signal charge amount. In the drawing, b is a graph illustrating an example of the relationship between an AD conversion value (digital signal Cnt_out) before correction of the pixel signal with the high conversion efficiency and a signal charge amount. In the drawing, c is a graph illustrating an example of the relationship between an AD conversion value after correction of the pixel signal with the high conversion efficiency and a signal charge amount. In b and c of the drawing, the vertical axis is AD conversion value in units of least significant bit (LSB), and the horizontal axis is signal charge amount.

As illustrated in a of the drawing, a pixel signal $Vsig_{HC}$ generated with the high conversion efficiency reaches the upper limit of the AD conversion range when the signal charge amount is S1. On the other hand, a pixel signal $Vsig_{LC}$ generated with the low conversion efficiency reaches the upper limit of the AD conversion range when the signal charge amount is S2 that is larger than S1.

Furthermore, as illustrated in b of the drawing, the AD conversion value of the pixel signal $Vsig_{HC}$ reaches the full code when the signal charge amount is S1. Note that the AD conversion value of the pixel signal $Vsig_{LC}$ reaches the full code when the signal charge amount is S2.

Then, in the dual gain mode, in a case where the AD conversion value of the pixel signal $Vsig_{HC}$ is less than the full code, the digital signal processing unit 261 in the subsequent stage corrects the signal and outputs the corrected signal. When the high conversion efficiency is $\mu_{HC}$ and the low conversion efficiency is PLC, the AD conversion value is corrected by multiplying the correction coefficient illustrated in the following formula.

(Correction coefficient)=$\mu_{LC}/\mu_{HC}$

In c of the drawing, the dotted line indicates AD conversion value before correction, and the thick solid line indicates AD conversion value after correction. On the other hand, in a case where the AD conversion value of the pixel signal $Vsig_{HC}$ is the full code, the digital signal processing unit 261 outputs the AD conversion value of the pixel signal $Vsig_{LC}$ without correction.

Note that although the digital signal processing unit 261 can correct the AD conversion value corresponding to the high conversion efficiency in accordance with the low conversion efficiency and conversely can correct the AD conversion value corresponding to the low conversion efficiency in accordance with the high conversion efficiency.

As described above, according to the third embodiment of the present technology, in the dual gain drive mode, the ADC 300 performs the AD conversion on each pixel signal with both the high conversion efficiency and the low conversion efficiency, and it is possible to reduce noise when illuminance is low.

4. Application Examples to Mobile Objects

The technology according to the present disclosure (present technology) is applicable to a variety of products. For example, the technology according to the present disclosure may be implemented as apparatuses mounted on any type of movable bodies such as automobiles, electric vehicles, hybrid electric vehicles, motorcycles, bicycles, personal mobilities, airplanes, drones, ships, or robots.

Figure 29:
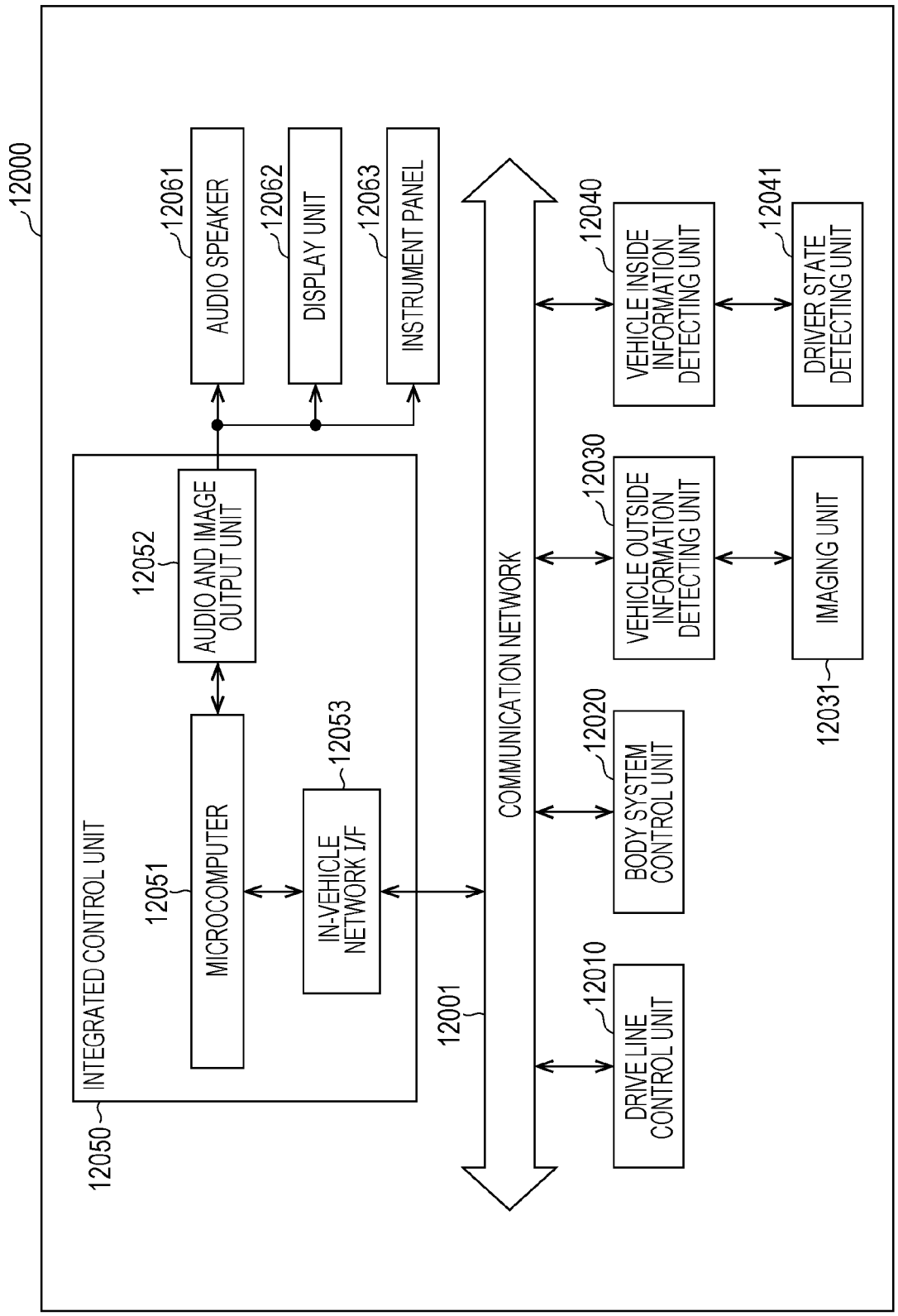
FIG. 29 is a block diagram illustrating a schematic configuration example of a vehicle control system.

FIG. 29 is a block diagram illustrating a schematic configuration example of a vehicle control system, which is an example of a movable body control system to which the technology according to the present disclosure can be applied.

The vehicle control system 12000 includes a plurality of electronic control units connected via a communication network 12001. In the example illustrated in FIG. 29, the vehicle control system 12000 includes a drive line control unit 12010, a body system control unit 12020, a vehicle outside information detecting unit 12030, a vehicle inside information detecting unit 12040, and an integrated control unit 12050. Furthermore, a microcomputer 12051, an audio and image output unit 12052, and an in-vehicle network interface (I/F) 12053 are illustrated as functional configurations of the integrated control unit 12050.

The drive line control unit 12010 controls the operation of apparatuses related to the drive line of the vehicle in accordance with a variety of programs. For example, the drive line control unit 12010 functions as a control apparatus for a driving force generating apparatus such as an internal combustion engine or a driving motor that generates the driving force of the vehicle, a driving force transferring mechanism that transfers the driving force to wheels, a steering mechanism that adjusts the steering angle of the vehicle, a braking apparatus that generates the braking force of the vehicle, and the like.

The body system control unit 12020 controls the operations of a variety of apparatuses attached to the vehicle body in accordance with a variety of programs. For example, the body system control unit 12020 functions as a control apparatus for a keyless entry system, a smart key system, a power window apparatus, or a variety of lights such as a headlight, a backup light, a brake light, a blinker, or a fog lamp. In this case, the body system control unit 12020 can receive radio waves transmitted from a portable device that serves instead of the key or signals of a variety of switches. The body system control unit 12020 accepts input of these radio waves or signals, and controls the door lock apparatus, the power window apparatus, the lights, or the like of the vehicle.

The vehicle outside information detecting unit 12030 detects information regarding the outside of the vehicle including the vehicle control system 12000. For example, the imaging unit 12031 is connected to the vehicle outside information detecting unit 12030. The vehicle outside information detecting unit 12030 causes the imaging unit 12031 to capture images of the outside of the vehicle, and receives the captured image. The vehicle outside information detecting unit 12030 may perform processing of detecting an object such as a person, a car, an obstacle, a traffic sign, or a letter on a road, or processing of detecting the distance on the basis of the received image.

The imaging unit 12031 is an optical sensor that receives light and outputs an electric signal corresponding to the amount of received light. The imaging unit 12031 can output the electric signal as the image or output the electric signal as ranging information. Furthermore, the light received by the imaging unit 12031 may be visible light or invisible light such as infrared light.

The vehicle inside information detecting unit 12040 detects information of the inside of the vehicle. The vehicle inside information detecting unit 12040 is connected, for example, to a driver state detecting unit 12041 that detects the state of the driver. The driver state detecting unit 12041 includes, for example, a camera that images a driver, and the vehicle inside information detecting unit 12040 may compute the degree of the driver's tiredness or the degree of the driver's concentration or determine whether or not the driver has a doze, on the basis of detection information input from the driver state detecting unit 12041.

The microcomputer 12051 can calculate a control target value of the driving force generating apparatus, the steering mechanism, or the braking apparatus on the basis of information regarding the inside and outside of the vehicle acquired by the vehicle outside information detecting unit 12030 or the vehicle inside information detecting unit 12040, and output a control instruction to the drive line control unit 12010. For example, the microcomputer 12051 can perform cooperative control for the purpose of executing the functions of the advanced driver assistance system (ADAS) including vehicle collision avoidance or impact reduction, follow-up driving based on the inter-vehicle distance, constant vehicle speed driving, vehicle collision warning, vehicle lane deviation warning, or the like.

Furthermore, the microcomputer 12051 can perform cooperative control for the purpose of automatic driving or the like for autonomous running without depending on the driver's manipulation through control of the driving force generating apparatus, the steering mechanism, the braking apparatus, or the like on the basis of information around the vehicle acquired by the vehicle outside information detecting unit 12030 or the vehicle inside information detecting unit 12040.

Furthermore, the microcomputer 12051 can output a control instruction to the body system control unit 12020 on the basis of the information outside the vehicle obtained by the vehicle outside information detecting unit 12030. For example, the microcomputer 12051 can perform the cooperative control for realizing glare protection such as controlling the head light according to a position of a preceding vehicle or an oncoming vehicle detected by the vehicle outside information detecting unit 12030 to switch a high beam to a low beam.

The audio and image output unit 12052 transmits an output signal of at least one of a sound or an image to an output apparatus capable of visually or aurally notifying a passenger of the vehicle or the outside of the vehicle of information. In the example of FIG. 29, an audio speaker 12061, a display unit 12062, and an instrument panel 12063 are exemplified as the output apparatus. For example, the display unit 12062 may include at least one of an onboard display or a head-up display.

Figure 30:
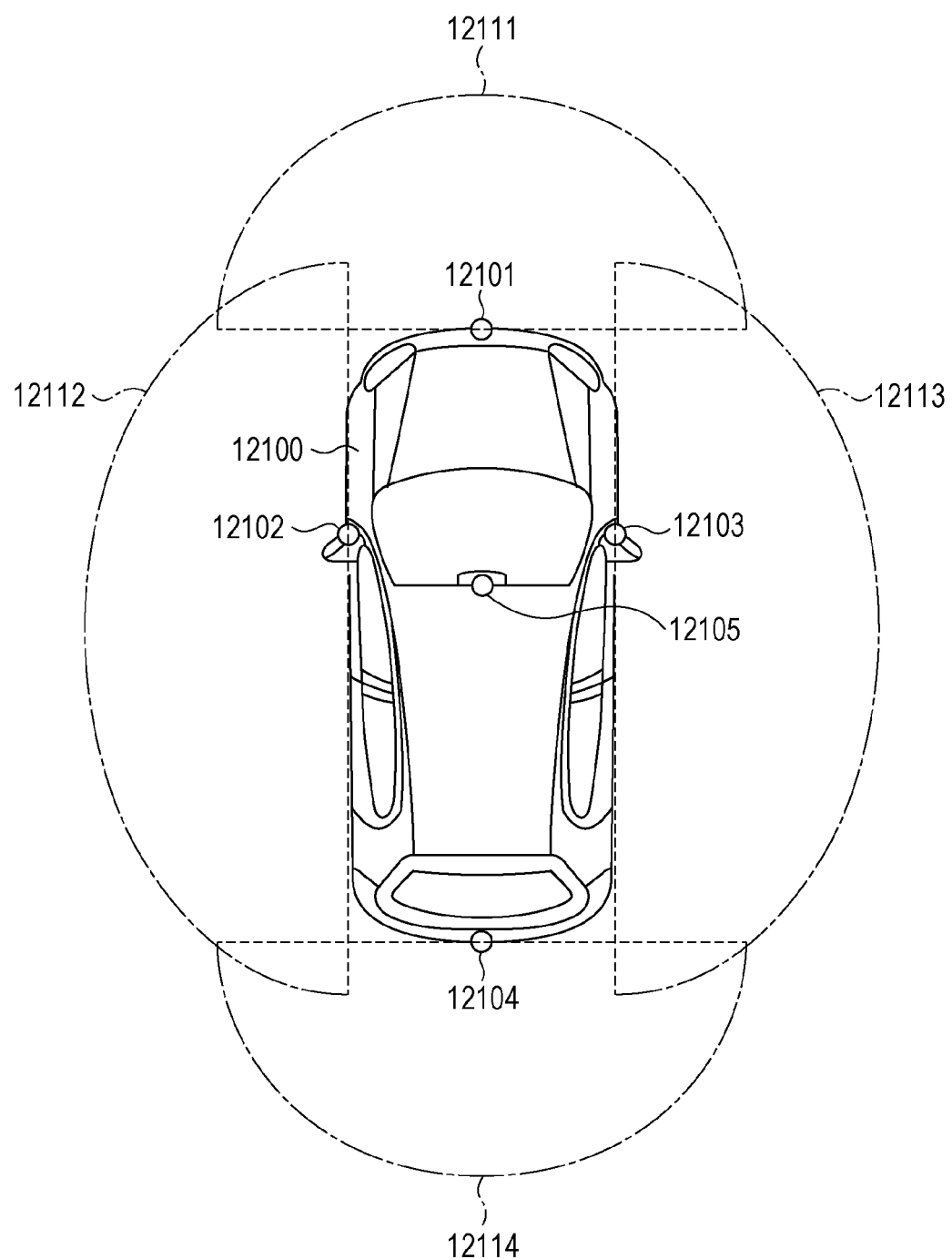
FIG. 30 is an explanatory diagram illustrating an example of an installation position of an imaging unit.

FIG. 30 is a view illustrating an example of an installation position of the imaging unit 12031.

In FIG. 30, imaging units 12101, 12102, 12103, 12104, and 12105 are provided as the imaging unit 12031.

Imaging units 12101, 12102, 12103, 12104 and 12105 are positioned, for example, at the front nose, a side mirror, the rear bumper, the back door, the upper part of the windshield in the vehicle compartment, or the like of the vehicle 12100. The imaging unit 12101 attached to the front nose and the imaging unit 12105 attached to the upper part of the windshield in the vehicle compartment mainly acquire images of the area ahead of the vehicle 12100. The imaging units 12102 and 12103 attached to the side mirrors mainly acquire images of the areas on the sides of the vehicle 12100. The imaging unit 12104 attached to the rear bumper or the back door mainly acquires images of the area behind the vehicle 12100. The imaging unit 12105 attached to the upper part of the windshield in the vehicle compartment is used mainly to detect a preceding vehicle, a pedestrian, an obstacle, a traffic light, a traffic sign, a lane, or the like.

Note that FIG. 30 illustrates an example of the respective imaging ranges of the imaging units 12101 to 12104. An imaging range 12111 represents the imaging range of the imaging unit 12101 attached to the front nose. Imaging ranges 12112 and 12113 respectively represent the imaging ranges of the imaging units 12102 and 12103 attached to the side mirrors. An imaging range 12114 represents the imaging range of the imaging unit 12104 attached to the rear bumper or the back door. For example, overlaying image data captured by the imaging units 12101 to 12104 offers an overhead image that looks down on the vehicle 12100.

At least one of the imaging units 12101 to 12104 may have a function of obtaining distance information. For example, at least one of the imaging units 12101 to 12104 may be a stereo camera including a plurality of image sensors, or may be an image sensor having pixels for phase difference detection.

For example, the microcomputer 12051 may extract especially a closest three-dimensional object on a traveling path of the vehicle 12100, the three-dimensional object traveling at a predetermined speed (for example, 0 km/h or higher) in a direction substantially the same as that of the vehicle 12100 as the preceding vehicle by determining a distance to each three-dimensional object in the imaging ranges 12111 to 12114 and change in time of the distance (relative speed relative to the vehicle 12100) on the basis of the distance information obtained from the imaging units 12101 to 12104. Moreover, the microcomputer 12051 can set an inter-vehicle distance to be secured in advance from the preceding vehicle, and can perform automatic brake control (including follow-up stop control), automatic acceleration control (including follow-up start control), and the like. In this manner, it is possible to perform the cooperative control for realizing automatic driving or the like to autonomously travel independent from the manipulation of the driver.

For example, the microcomputer 12051 can extract three-dimensional object data regarding the three-dimensional object while sorting the data into a two-wheeled vehicle, a regular vehicle, a large vehicle, a pedestrian, and other three-dimensional object such as a utility pole on the basis of the distance information obtained from the imaging units 12101 to 12104 and use the data for automatically avoiding obstacles. For example, the microcomputer 12051 discriminates obstacles around the vehicle 12100 into an obstacle visibly recognizable to a driver of the vehicle 12100 and an obstacle difficult to visually recognize. Then, the microcomputer 12051 determines a collision risk indicating a degree of risk of collision with each obstacle, and when the collision risk is equal to or higher than a setting value and there is a possibility of collision, the microcomputer 12051 can perform driving assistance for avoiding the collision by outputting an alarm to the driver via the audio speaker 12061 and the display unit 12062 or performing forced deceleration or avoidance steering via the drive line control unit 12010.

At least one of the imaging units 12101 to 12104 may be an infrared camera for detecting infrared rays. For example, the microcomputer 12051 can recognize a pedestrian by determining whether or not there is a pedestrian in the captured images of the imaging units 12101 to 12104. Such pedestrian recognition is carried out, for example, by a procedure of extracting feature points in the captured images of the imaging units 12101 to 12104 as infrared cameras and a procedure of performing pattern matching processing on a series of feature points indicating an outline of an object to discriminate whether or not the object is a pedestrian. When the microcomputer 12051 determines that there is a pedestrian in the captured images of the imaging units 12101 to 12104 and recognizes the pedestrian, the audio and image output unit 12052 causes the display unit 12062 to superimpose a rectangular contour for emphasis on the recognized pedestrian. Furthermore, the audio and image output unit 12052 may causes the display unit 12062 to display icons or the like indicating pedestrians at desired positions.

An example of the vehicle control system to which the technology according to the present disclosure is applicable is heretofore described. The technology according to the present disclosure can be applied to the imaging unit 12031 among the configurations described above. Specifically, the imaging apparatus 100 of FIG. 1 can be applied to the imaging unit 12031. By applying the technology according to the present disclosure to the imaging unit 12031, the speed of reading the image data can be increased and a moving image that is more viewable can be obtained, and thus driver fatigue can be reduced.

Note that the embodiments described above are examples for embodying the present technology, and matters in the embodiments each have a corresponding relationship with invention-specifying matters in the claims. Similarly, invention-specifying matters in the claims each have a corresponding relationship with matters in the embodiments of the present technology denoted by the same names. However, the present technology is not limited to the embodiments, and can be embodied by subjecting the embodiments to various variation in the scope without departing from the spirit.

Note that the effects described in the present description are merely illustrative and are not limitative, and other effects may be provided.

Note that the present technology may be configured as below.

(1) A signal processing circuit including:

an attenuation unit that, in a case where a level of an input signal exceeds a predetermined threshold value, attenuates the input signal and outputs the input signal as an output signal;

a comparison device that compares the output signal with a predetermined reference signal that varies with lapse of time, and outputs a comparison result;

a counter that counts a count value until the comparison result is inverted and outputs a digital signal indicating the count value; and a digital signal processing unit that performs multiplication processing on the digital signal.

(2) The signal processing circuit according to (1), in which the attenuation unit attenuates the input signal at a predetermined attenuation rate in a case where the level exceeds the threshold value, and the digital signal processing unit performs the multiplication processing that multiplies a reciprocal of the attenuation rate on the digital signal.

(3) The signal processing circuit according to (1) or (2), further including:

a sample-hold circuit that holds a predetermined reset level and outputs the predetermined reset level from an output terminal, in which a level of a signal line that transmits the input signal changes to one of the reset level and the signal level, and the attenuation unit includes:

a first capacitance that is inserted between the signal line and an input terminal of the comparison device;

a second capacitance that has one end connected to the input terminal of the comparison device; and a selector that, in a case where a difference between the reset level and the signal level exceeds the threshold value, selects the output terminal of the sample-hold circuit and connects the output terminal to another end of the second capacitance and, in a case where the level does not exceed the threshold value, selects the signal line and connects the signal line to the another end.

(4) The signal processing circuit according to (3), further including:

a latch circuit that holds the comparison result and supplies the comparison result to the selector when the level of the signal line changes to the signal level, in which a level of the reference signal when the level of the signal line changes to the signal level is a level corresponding to the threshold value, and the selector switches a connection destination of the another end of the second capacitance according to the comparison result.

(5) The signal processing circuit according to (3) or (4), in which the digital signal processing unit includes:

an offset calculation unit that calculates an offset component generated in the sample-hold circuit;

an offset holding unit that holds the offset component; and a correction processing unit that removes the held offset component in the multiplication processing.

(6) The signal processing circuit according to (5), in which the digital signal processing unit further includes:

a statistical processing unit that obtains an amount of statistics of a plurality of the digital signals, and the offset calculation unit calculates the offset component from the amount of statistics.

(7) The signal processing circuit according to (1) or (2), further including:

a sample-hold circuit that holds a predetermined reset level and outputs the predetermined reset level from an output terminal, in which a level of a signal line that transmits the input signal changes to one of the reset level and the signal level, and the attenuation unit includes:

a first selector that, in a case where a difference between the reset level and the signal level exceeds the threshold value, selects the output terminal of the sample-hold circuit and, in a case where the level does not exceed the threshold value, selects the signal line;

a plurality of capacitances that is connected in parallel to an input terminal of the comparison device; and a second selector that connects some of the plurality of capacitances to an output terminal of the first selector and rest to the signal line according to a predetermined setting value.

(8) The signal processing circuit according to (1) or (2), further including:

a sample-hold circuit that holds a predetermined reset level and outputs the predetermined reset level from an output terminal, in which a level of a signal line that transmits the input signal changes to one of the reset level and the signal level, and the attenuation unit includes:

a first capacitance that has one end connected to an input terminal of the comparison device;

a second capacitance that has one end connected to the input terminal of the comparison device;

a first capacitance-side selector that connects one of the signal line and the output terminal to another end of the first capacitance according to a predetermined selection signal; and a second capacitance-side selector that, in a case where a difference between the reset level and the signal level exceeds the threshold value, selects the output terminal of the sample-hold circuit and connects the output terminal to another end of the second capacitance and, in a case where the level does not exceed the threshold value, selects the signal line and connects the signal line to the another end.

(9) A solid-state imaging element including:

a normal pixel that photoelectrically converts incident light and generates an analog input signal;

an attenuation unit that, in a case where a level of an input signal exceeds a predetermined threshold value, attenuates the input signal and outputs the input signal as an output signal;

a comparison device that compares the output signal with a predetermined reference signal that varies with lapse of time, and outputs a comparison result;

a counter that counts a count value until the comparison result is inverted and outputs a digital signal indicating the count value; and a digital signal processing unit that performs multiplication processing on the digital signal.

(10) The solid-state imaging element according to (9), further including:

a dummy pixel that inputs a dummy signal corresponding to a predetermined reference voltage to the attenuation unit as the input signal; and a sample-hold circuit that holds a predetermined reset level and outputs the predetermined reset level from an output terminal, in which a level of a signal line that transmits the input signal changes to one of the reset level and the signal level, and the attenuation unit includes:

a first capacitance that is inserted between the signal line and an input terminal of the comparison device;

a second capacitance that has one end connected to the input terminal of the comparison device; and a first selector that, in a case where a difference between the reset level and the signal level exceeds the threshold value, selects the output terminal of the sample-hold circuit and connects the output terminal to another end of the second capacitance and, in a case where the signal level does not exceed the threshold value, selects the signal line and connects the signal line to the another end, and the digital signal processing unit, in a case where the dummy signal is input, calculates an offset component generated in the sample-hold circuit from the digital signal.

(11) The solid-state imaging element according to (9), further including:

a sample-hold circuit that holds a predetermined reset level and outputs the predetermined reset level from an output terminal, in which a level of a signal line that transmits the input signal changes to one of the reset level and the signal level, and the attenuation unit includes:

a first capacitance that has one end connected to an input terminal of the comparison device;

a second capacitance that has one end connected to the input terminal of the comparison device;

a first capacitance-side selector that connects one of the signal line and the output terminal to another end of the first capacitance according to a predetermined selection signal; and a second capacitance-side selector that, in a case where a difference between the reset level and the signal level exceeds the threshold value, selects the output terminal of the sample-hold circuit and connects the output terminal to another end of the second capacitance and, in a case where the level does not exceed the threshold value, selects the signal line and connects the signal line to the another end.

(12) The solid-state imaging element according to (11), in which the pixel, in a case where a predetermined normal mode is set, generates the input signal with one of high conversion efficiency that is a charge-voltage conversion efficiency higher than a predetermined value and low conversion efficiency that is a charge-voltage conversion efficiency lower than the predetermined value and, in a case where a predetermined dual gain mode is set, generates the input signal with both the high conversion efficiency and the low conversion efficiency, and the first capacitance-side selector, in a case where the normal mode is set, connects the signal line to another end of the first capacitance and, in a case where the dual gain mode is set, connects the output terminal to the another end in a period of the reset level generated with the low conversion efficiency and connects the signal line to the another end outside the period.

(13) A method for controlling a signal processing circuit, the method including:

a level control step of, in a case where a level of an input signal exceeds a predetermined threshold value, attenuating the input signal and outputting the input signal as an output signal;

a comparison step of comparing the output signal with a predetermined reference signal that varies with lapse of time and outputting a comparison result;

a coefficient step of counting a count value until the comparison result is inverted and outputting a digital signal indicating the count value; and a digital processing step of performing multiplication processing on the digital signal.

REFERENCE SIGNS LIST

100 Imaging apparatus
110 Imaging lens
120 Storage unit
130 Imaging control unit
200 Solid-state imaging element
211 Vertical scanning circuit
212 Pixel array unit
213 Timing control circuit
214 DAC
215 Reference voltage generation unit
220 Pixel
221 Photodiode
222 Transfer transistor
223 Reset transistor
224 Floating diffusion layer
225, 241 Amplification transistor
226, 242 Selection transistor
227 Conversion efficiency control transistor
230 Normal pixel
240 Dummy pixel
250 Load MOS circuit block
251 Load MOS circuit
260 Column signal processing circuit
261 Digital signal processing unit
262 Correction processing unit
263 Offset holding unit
264 Statistical processing unit
265 Offset calculation unit
300 ADC
310 Sample-hold circuit
311 to 315, 351, 352 Switch
321 to 325, 327, 353, 361, 362, 365 Capacitance
326 Amplifier
350 Comparator
354 Latch circuit
355 Comparison device
356 Connection destination setting value holding unit
360 Attenuation unit
363, 364, 380 Selector
370 Counter
381, 382, 391, 392 N-type transistor
393 Inverter
12031 Imaging unit

The invention claimed is:

1. A signal processing circuit comprising:
attenuation circuitry that, in a case where a level of an input signal exceeds a predetermined threshold value, attenuates the input signal and outputs the input signal as an output signal;
comparison circuitry that compares the output signal with a predetermined reference signal that varies with lapse of time, and outputs a comparison result;
a counter that counts a count value until the comparison result is inverted and outputs a digital signal indicating the count value;
a digital signal processor that performs multiplication processing on the digital signal; and
a sample-hold circuit that holds a predetermined reset level and outputs the predetermined reset level from an output terminal, wherein a level of a signal line that transmits the input signal changes to one of the reset level and the signal level,
wherein the attenuation circuitry includes:
a first capacitance that is inserted between the signal line and an input terminal of the comparison device,
a second capacitance that has one end connected to the input terminal of the comparison device, and
a first selector that, in a case where a difference between the reset level and the signal level exceeds the threshold value, selects the output terminal of the sample-hold circuit and connects the output terminal to another end of the second capacitance and, in a case where the level does not exceed the threshold value, selects the signal line and connects the signal line to the another end.

2. The signal processing circuit according to claim 1, wherein the attenuation circuitry attenuates the input signal at a predetermined attenuation rate in a case where the level exceeds the threshold value, and the digital signal processor performs the multiplication processing that multiplies a reciprocal of the attenuation rate on the digital signal.

3. The signal processing circuit according to claim 1, further comprising:
a latch circuit that holds the comparison result and supplies the comparison result to the first selector when the level of the signal line changes to the signal level, wherein a level of the reference signal when the level of the signal line changes to the signal level is a level corresponding to the threshold value, and
the first selector switches a connection destination of the another end of the second capacitance according to the comparison result.

4. The signal processing circuit according to claim 1, wherein the digital signal processor includes:
offset calculation circuitry that calculates an offset component generated in the sample-hold circuit;
a memory that holds the offset component; and
a correction processor that removes the held offset component in the multiplication processing.

5. The signal processing circuit according to claim 4, wherein the digital signal processor further includes:
statistical processing circuitry that obtains an amount of statistics of a plurality of the digital signals, and wherein
the offset calculation circuitry calculates the offset component from the amount of statistics.

6. The signal processing circuit according to claim 1, wherein:
wherein the first capacitance and the second capacitance are among a plurality of capacitances connected in parallel to the input terminal of the comparison device; and
the attenuation circuitry includes a second selector that connects some of the plurality of capacitances to an output terminal of the first selector and a remainder of the plurality of capacitances to the signal line according to a predetermined setting value.

7. The signal processing circuit according to claim 1, wherein the attenuation circuitry includes:
a first capacitance-side selector that connects one of the signal line and the output terminal to another end of the first capacitance according to a predetermined selection signal; and
a second capacitance-side selector that, in a case where a difference between the reset level and the signal level exceeds the threshold value, selects the output terminal of the sample-hold circuit and connects the output terminal to another end of the second capacitance and, in a case where the level does not exceed the threshold value, selects the signal line and connects the signal line to the another end.

8. A solid-state imaging element comprising:
a normal pixel that photoelectrically converts incident light and generates an analog input signal;
attenuation circuitry that, in a case where a level of the input signal exceeds a predetermined threshold value, attenuates the input signal and outputs the input signal as an output signal;
comparison circuitry that compares the output signal with a predetermined reference signal that varies with lapse of time, and outputs a comparison result; a counter that counts a count value until the comparison result is inverted and outputs a digital signal indicating the count value;
a digital signal processor that performs multiplication processing on the digital signal; and
a sample-hold circuit that holds a predetermined reset level and outputs the predetermined reset level from an output terminal, wherein a level of a signal line that transmits the input signal changes to one of the reset level and the signal level,
wherein the attenuation circuitry includes:
a first capacitance that is inserted between the signal line and an input terminal of the comparison device,
a second capacitance that has one end connected to the input terminal of the comparison device, and
a selector that, in a case where a difference between the reset level and the signal level exceeds the threshold value, selects the output terminal of the sample-hold circuit and connects the output terminal to another end of the second capacitance and, in a case where the signal level does not exceed the threshold value, selects the signal line and connects the signal line to the another end, and the digital signal processor, in a case where a dummy signal is input, calculates an offset component generated in the sample-hold circuit from the digital signal.

9. The solid-state imaging element according to claim 8, further comprising:
a dummy pixel that inputs the dummy signal corresponding to a predetermined reference voltage to the attenuation circuitry as the input signal.

10. The solid-state imaging element according to claim 8, wherein the attenuation circuitry includes:
a first capacitance-side selector that connects one of the signal line and the output terminal to another end of the first capacitance according to a predetermined selection signal; and
a second capacitance-side selector that, in a case where a difference between the reset level and the signal level exceeds the threshold value, selects the output terminal of the sample-hold circuit and connects the output terminal to another end of the second capacitance and, in a case where the level does not exceed the threshold value, selects the signal line and connects the signal line to the another end.

11. The solid-state imaging element according to claim 10, wherein the pixel, in a case where a predetermined normal mode is set, generates the input signal with one of high conversion efficiency that is a charge-voltage conversion efficiency higher than a predetermined value and low conversion efficiency that is a charge-voltage conversion efficiency lower than the predetermined value and, in a case where a predetermined dual gain mode is set, generates the input signal with both the high conversion efficiency and the low conversion efficiency, and the first capacitance-side selector, in a case where the normal mode is set, connects the signal line to another end of the first capacitance and, in a case where the dual gain mode is set, connects the output terminal to the another end in a period of the reset level generated with the low conversion efficiency and connects the signal line to the another end outside the period.

12. A method for controlling a signal processing circuit, the method comprising:
in a case where a level of an input signal exceeds a predetermined threshold value, attenuating, by attenuation circuitry, the input signal and outputting the input signal as an output signal;
comparing the output signal with a predetermined reference signal that varies with lapse of time and outputting a comparison result;
counting a count value until the comparison result is inverted and outputting a digital signal indicating the count value;
performing multiplication processing on the digital signal; and
holding, by a sample-hold circuit, a predetermined reset level and outputs the predetermined reset level from an output terminal, wherein a level of a signal line that transmits the input signal changes to one of the reset level and the signal level,
wherein the attenuation circuitry includes a first capacitance that is inserted between the signal line and an input terminal of the comparison device, a second capacitance that has one end connected to the input terminal of the comparison device, and a first selector that, in a case where a difference between the reset level and the signal level exceeds the threshold value, selects the output terminal of the sample-hold circuit and connects the output terminal to another end of the second capacitance and, in a case where the level does not exceed the threshold value, selects the signal line and connects the signal line to the another end.

* * * * *